(12) United States Patent
Kim et al.

(10) Patent No.: US 12,295,242 B2
(45) Date of Patent: May 6, 2025

(54) DISPLAY DEVICE AND METHOD OF CONTROLLING THE SAME

(71) Applicant: Samsung Display Co., LTD., Yongin-si (KR)

(72) Inventors: Sang Ho Kim, Yongin-si (KR); Soo Min Baek, Yongin-si (KR); Ju Hwa Ha, Yongin-si (KR); Ju Youn Son, Yongin-si (KR); Ji Won Lee, Yongin-si (KR); Cheon Myeong Lee, Yongin-si (KR); Bek Hyun Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/132,968

(22) Filed: Apr. 11, 2023

(65) Prior Publication Data

US 2023/0413650 A1 Dec. 21, 2023

(30) Foreign Application Priority Data

Jun. 20, 2022 (KR) .................. 10-2022-0075077

(51) Int. Cl.
| | |
|---|---|
| *G02B 27/01* | (2006.01) |
| *G02B 27/00* | (2006.01) |
| *G06F 1/16* | (2006.01) |
| *G06F 3/01* | (2006.01) |
| *G09G 3/00* | (2006.01) |

(Continued)

(52) U.S. Cl.
CPC ....... *H10K 59/879* (2023.02); *G02B 27/0018* (2013.01); *G02B 27/0093* (2013.01); *G06F 1/163* (2013.01); *G06F 3/013* (2013.01); *G09G 3/001* (2013.01); *G09G 3/3233* (2013.01); *H10K 59/90* (2023.02); *G09G 2300/023* (2013.01); *G09G 2300/0465* (2013.01); *G09G 2340/0407* (2013.01); *G09G 2340/12* (2013.01);

(Continued)

(58) Field of Classification Search
None
See application file for complete search history.

(56) References Cited

U.S. PATENT DOCUMENTS

| | | |
|---|---|---|
| 9,779,478 B1 | 10/2017 | Wilson et al. |
| 10,768,371 B1 | 9/2020 | Wheelwright et al. |

(Continued)

FOREIGN PATENT DOCUMENTS

| | | |
|---|---|---|
| CN | 106940478 A | 7/2017 |
| CN | 112419986 | 2/2021 |

(Continued)

OTHER PUBLICATIONS

Translation of FR-3107611-A1 into English; Olivier et al. (Year: 2021).*

(Continued)

*Primary Examiner* — Brian M Butcher
(74) *Attorney, Agent, or Firm* — CANTOR COLBURN LLP

(57) ABSTRACT

A display device includes: a first display panel having a first resolution; a second display panel having a second resolution; and a first multi-channel lens and a second multi-channel lens disposed on one surface of the first display panel and including a plurality of channels through which light emitted from the one surface of the first display panel passes, where the second resolution is higher than the first resolution.

5 Claims, 31 Drawing Sheets

(51) Int. Cl.
  G09G 3/3233 (2016.01)
  H10K 59/80 (2023.01)
  H10K 59/90 (2023.01)
  H01L 25/16 (2023.01)
  H10K 59/12 (2023.01)

(52) U.S. Cl.
  CPC ........ *G09G 2354/00* (2013.01); *H01L 25/167* (2013.01); *H10K 59/12* (2023.02)

(56) References Cited

U.S. PATENT DOCUMENTS

| | | | |
|---|---|---|---|
| 10,962,795 | B1 | 3/2021 | Gollier et al. |
| 2017/0147859 | A1 | 5/2017 | Zhang et al. |
| 2020/0166752 | A1 | 5/2020 | Konttori et al. |
| 2020/0310145 | A1 | 10/2020 | Eash et al. |
| 2021/0405379 | A1 | 12/2021 | Bhakta et al. |

FOREIGN PATENT DOCUMENTS

| | | | |
|---|---|---|---|
| CN | 214586228 | 11/2021 | |
| FR | 3107611 A1 * | 8/2021 | ............ G06F 3/013 |
| KR | 101455714 | 11/2014 | |
| KR | 20220031850 | 3/2022 | |
| WO | 2016118640 A1 | 7/2016 | |

OTHER PUBLICATIONS

Partial Extended European Search Report—European Application No. 23180167.1 dated Nov. 7, 2023, citing references listed within.
Mohedano Ruben et al: Exploring the limits of CLOVER:a multi-channel optics for VR and MR, Proc. of SPIE, (2021), vol. 12078, pp. 1207802-1-1207802-7.
Extended European Search Report mailed Mar. 15, 2024 in Corresponding EP Application No. EP23180167.1, 18 pages.

* cited by examiner

DP : DP1, DP2
LS : LS1, LS2

LS1: LS11, LS12, LS13, LS14
LS2: LS21, LS22, LS23, LS24

LS1: LS11, LS12, LS13, LS14
LS2: LS21, LS22, LS23, LS24

DISPLAY DEVICE AND METHOD OF CONTROLLING THE SAME

This application claims priority to Korean Patent Application No. 10-2022-0075077 filed, on Jun. 20, 2022, and all the benefits accruing therefrom under 35 U.S.C. § 119, the content of which in its entirety is herein incorporated by reference.

BACKGROUND

1. Technical Field

The present disclosure relates to a display device and a method of controlling the same.

2. Description of the Related Art

The importance of display devices has steadily increased with the development of multimedia technology. Accordingly, various types of the display devices such as a liquid crystal display ("LCD") device, an organic light emitting display ("OLED") device and the like have been used.

Among the display devices, there are electronic devices provided in a form that can be worn on the body. Such electronic devices are typically referred to as wearable devices. The wearable electronic device is directly worn on the body, thus improving portability and user accessibility.

As an example of the wearable electronic device, there is a head mounted display (head mounted electronic device, "HMD") that can be mounted on the head of the wearer. HMD can be largely divided into a see-through type that provides augmented reality ("AR") and a see-closed type that provides virtual reality ("VR").

A near-eye display such as the head mounted display is desirable to get high-resolution images over a wide field of view ("FOV").

SUMMARY

Aspects of the present disclosure provide a display device enabling a user to recognize a high-resolution image by using a high-resolution display panel having a small area and a low-resolution display panel having a large area, and also provide a method of controlling the same.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display device includes: a first display panel having a first resolution; a second display panel having a second resolution; and a first multi-channel lens and a second multi-channel lens disposed on one surface of the first display panel and one surface of the second display panel and including a plurality of channels through which light emitted from the one surface of the first display panel and the one surface of the second display panel passes, where the second resolution is higher than the first resolution and the first display panel surrounds the second display panel in a plan view.

The second display panel may have about twice as many pixels per inch ("PPI") as the first display panel.

The first display panel may include a first sub-display panel corresponding to a left eye and a second sub-display panel corresponding to a right eye, and the second display panel comprises a third sub-display panel corresponding to the left eye and a fourth sub-display panel corresponding to the right eye.

Each of the first sub-display panel and the second sub-display panel may have a viewing angle of about 200 to about 80°, and each of the third sub-display panel and the fourth sub-display panel has a viewing angle of about 1° to about 20°.

The third sub-display panel may define at its center a through-hole in which the first sub-display panel is embedded, and the fourth sub-display panel may define at its center a through-hole in which the second sub-display panel is embedded.

According to an embodiment, a display device includes: a first display panel having a first resolution; a second display panel having a second resolution; a first multi-channel lens and a second multi-channel lens disposed on one surface of the first display panel and comprising a plurality of channels through which light emitted from the one surface of the first display panel passes; an eye tracking unit configured to detect a user's gaze direction; and a light steerer configured to control a direction of light emitted from the second display panel based on the gaze direction, where the second resolution is higher than the first resolution and the second display panel overlaps the first display panel in a plan view.

The second display panel may have about twice as many pixels per inch (PPI) as the first display panel.

The first display panel may be a transparent display panel, the second display panel may be disposed on the other surface of the first display panel opposite to the one surface, and the light emitted from the second display panel may be transmitted through the first display panel.

The first display panel may display a first display image, the second display panel may display a second display image, and the first display image may be an image in which an area overlapping the second display image in the plan view is cut out.

The light steerer may be disposed between the first display panel and the second display panel.

The light steerer may be a deflector.

The eye tracking unit may include: a plurality of infrared light sources disposed on the one surface of the first display panel and for emitting infrared rays; and a plurality of infrared cameras configured to sense infrared rays reflected from the user's pupil after being emitted from the infrared light sources.

The first display panel may include a transmission region configured to transmit infrared rays incident on the one surface, and the plurality of infrared cameras may be disposed on the other surface of the first display panel to overlap the transmission region in the plan view.

According to an embodiment, a display device includes: a first display panel having a first resolution; a second display panel having a second resolution and not overlapping the first display panel in a thickness direction of the first display panel; a first multi-channel lens and a second multi-channel lens disposed on one surface of the first display panel and comprising a plurality of channels through which light emitted from the one surface of the first display panel passes; an eye tracking unit configured to detect a user's gaze direction; and an optical path changing member disposed on an optical path of light emitted from the second display panel to control a direction of the light emitted from the second display panel based on the gaze direction, where the second resolution is higher than the first resolution.

The second display panel may have about twice as many pixels per inch (PPI) as the first display panel.

The optical path changing member may include a half mirror (ML) and a concave mirror (CCL).

The half mirror (ML) may be disposed between the second display panel and the concave mirror (CCL), transmit light incident from the second display panel, and reflect incident light reflected from the concave mirror (CCL).

The display device may further include at least one light magnification member between the second display panel and the half mirror (ML).

The light magnification member may be any one of a convex lens and a concave lens.

The display device may further include: a reflective polarization film disposed on a surface of the half mirror on which the light reflected from the concave mirror is incident; and a phase delay element disposed in parallel with the half mirror.

The optical path changing member may further include a reflective polarizer and a phase delay element disposed in parallel with the reflective polarizer.

The first display panel may display a first display image, the second display panel displays a second display image, and the first display image is an image in which an area overlapping the second display image in the thickness direction is cut out.

According to an embodiment, a method of controlling a display device, includes: detecting a user's pupil position by an eye tracking unit; synchronizing an image signal inputted to a first display panel having a first resolution with an image signal inputted to a second display panel having a second resolution; generating, as a second display image of a second display panel, an image corresponding to a foveal vision from an entire image based on the detected pupil position; and displaying a first display image corresponding to the entire image except for the second display image by the first display panel and displaying the second display image by the second display panel.

The displaying of the second display image may include generating, by a processor, the first display image obtained by cutting out an image overlapping the second display image from original image, and displaying the generated first display image as the entire image through the first display panel.

The user may be enabled to recognize a high-resolution image by using a high-resolution display panel having a small area according to one embodiment.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Figure 1A:
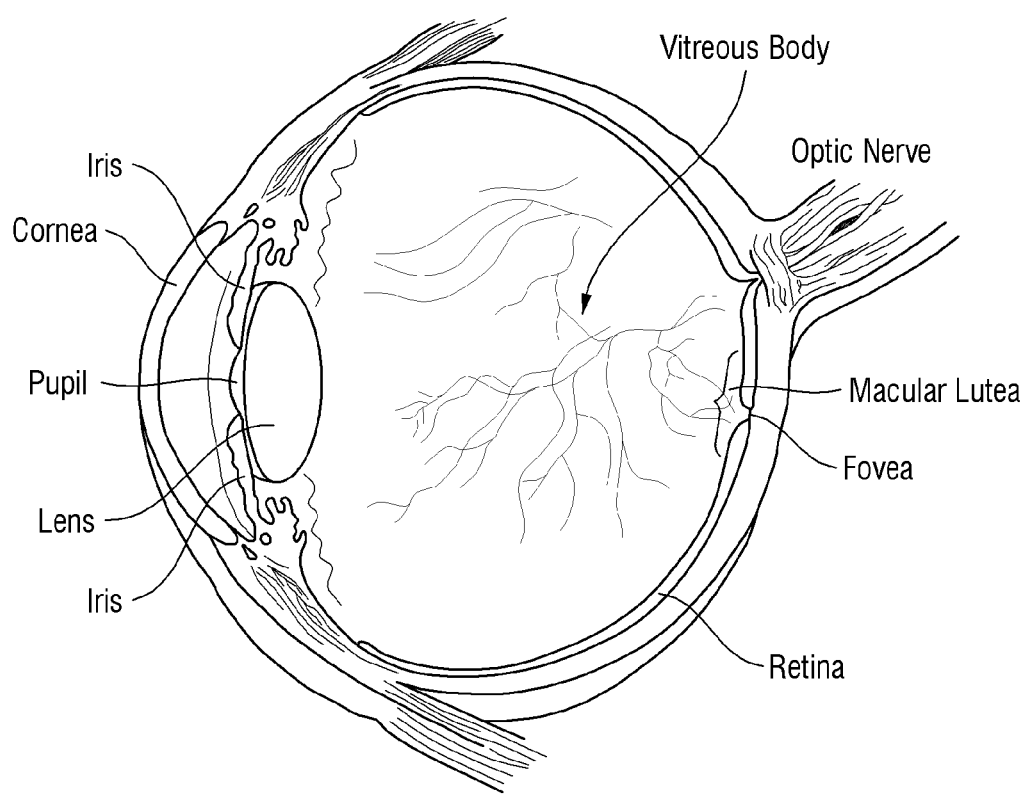
FIG. 1A illustrates an eye with a retina and a fovea.

FIG. 1A illustrates an eye with a retina and a fovea.

Referring to FIG. 1A, the human retina refers to a substantial part of the inner surface of an eye (e.g., a human eye, a viewer, etc.) having a visual sensor. The fovea is a relatively small midsection of the retina, located on a straight line from the centers of the cornea and the lens, where a number of visual cells with the clearest field of view and capable of receiving the most sensitive color in the eye are concentrated. The fovea has a field of view of approximately 2° from the center thereof At a degree of more than 200 from the center of the fovea, the clearness of the field of view decreases by almost a factor of 10 (i.e., to be one tenth).

In one embodiment, a display device includes a first display panel providing a lower resolution image over a wider field of view, and a second display panel providing a higher resolution image over a narrower field of view.

Figure 1B:
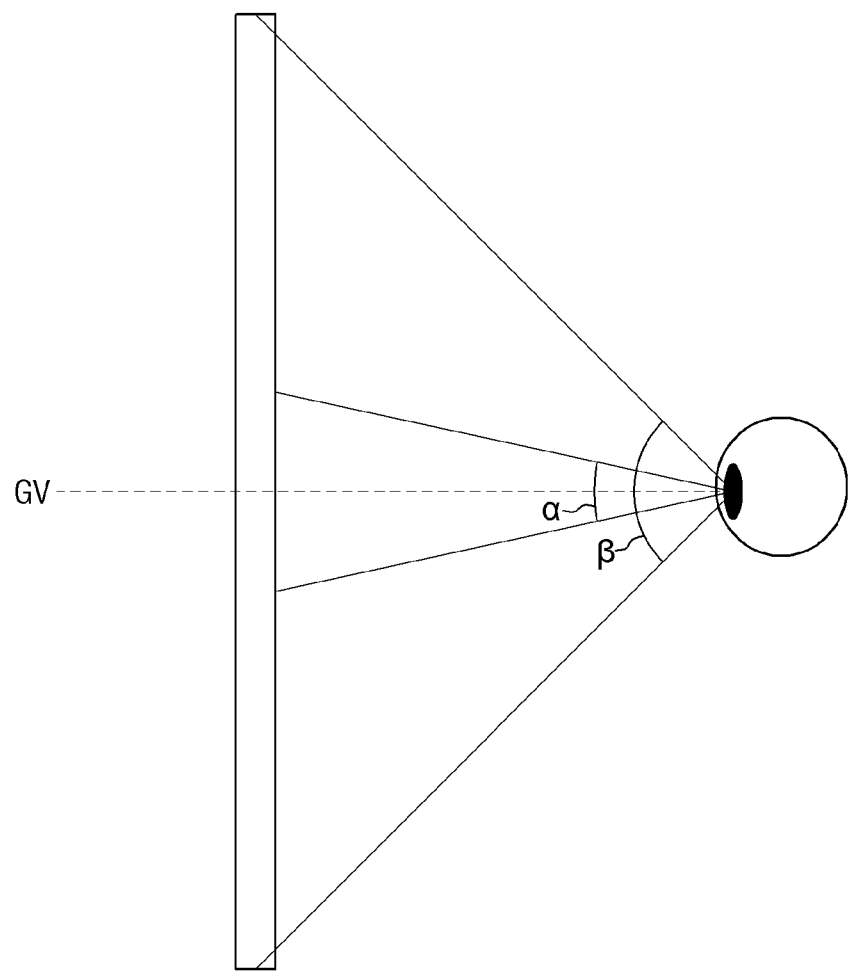
FIGS. 1B and 1C are a cross-sectional view and a plan view for describing the field of view of one eye, respectively.
Figure 1C:
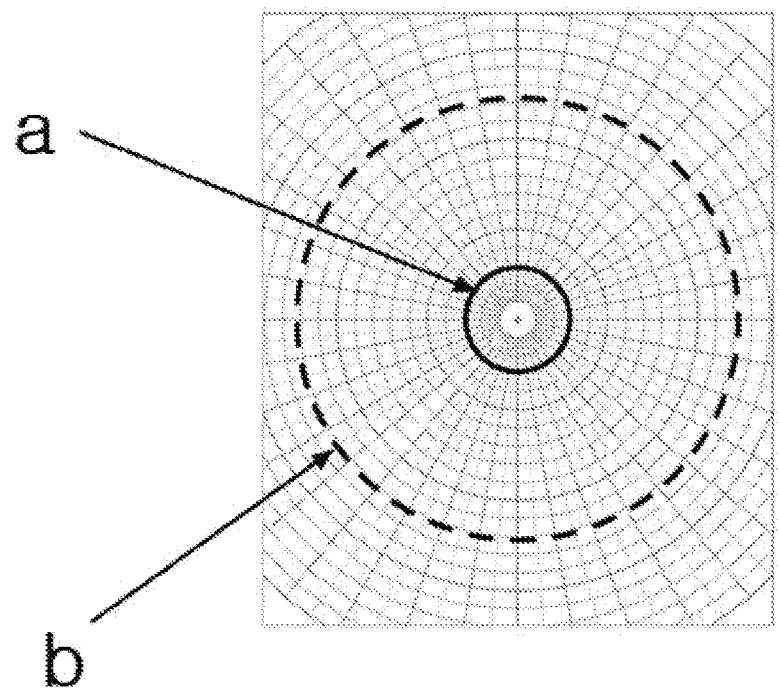

FIGS. 1B and 1C are a cross-sectional view and a plan view for describing the field of view of one eye, respectively. Here, the plan view is a view in Z-axis direction. In one embodiment, a second display panel (DP2 of FIG. 4) of a display device 1 to be described later is positioned so that a gaze vector GV is located at the center thereof. The gaze vector GV defines the center of the field of view of the eye.

The second display panel (DP2 of FIG. 4) has a field of view α narrower than field of view of a first display panel (DP1 of FIG. 4), and the first display panel (DP1 of FIG. 4) has a wider field of view β.

The α may be between 1° (minimum field of view) and 30°. The β may be between 60° and 110°.

Referring to FIG. 1C, when the second display panel D2 is positioned so that the gaze vector GV is located at the center thereof, a second display area, which is an image display area by the second display panel DP2, may be represented as a circle 'a' around the gaze vector GV. A first display area, which is an image display area by the first display panel DP1, may be represented as an external area 'b' surrounding the second display area. The first display area and the second display area may not overlap each other.

Figure 2:
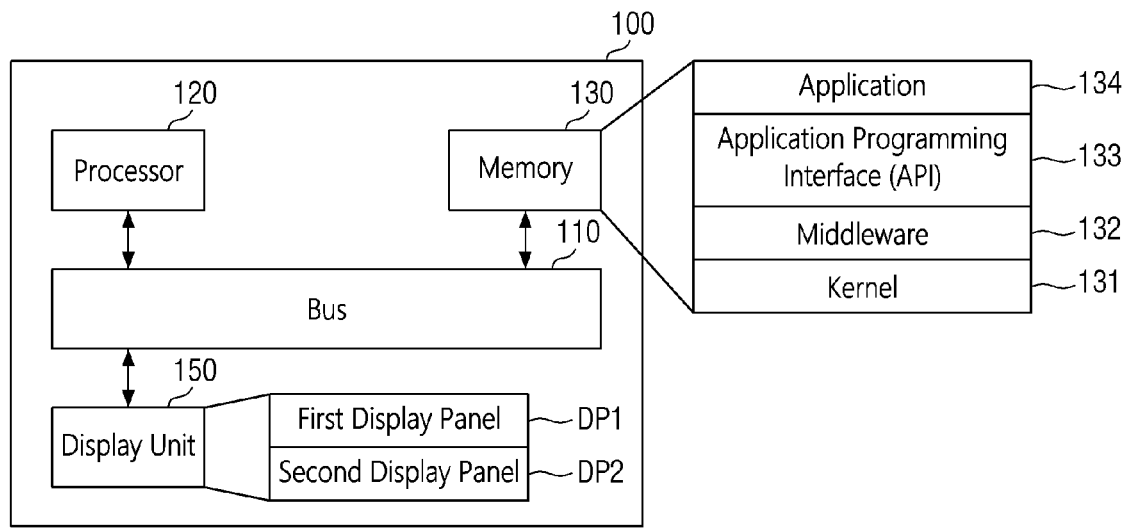
FIG. 2 is a schematic block diagram of a display device according to one embodiment.
Figure 3:
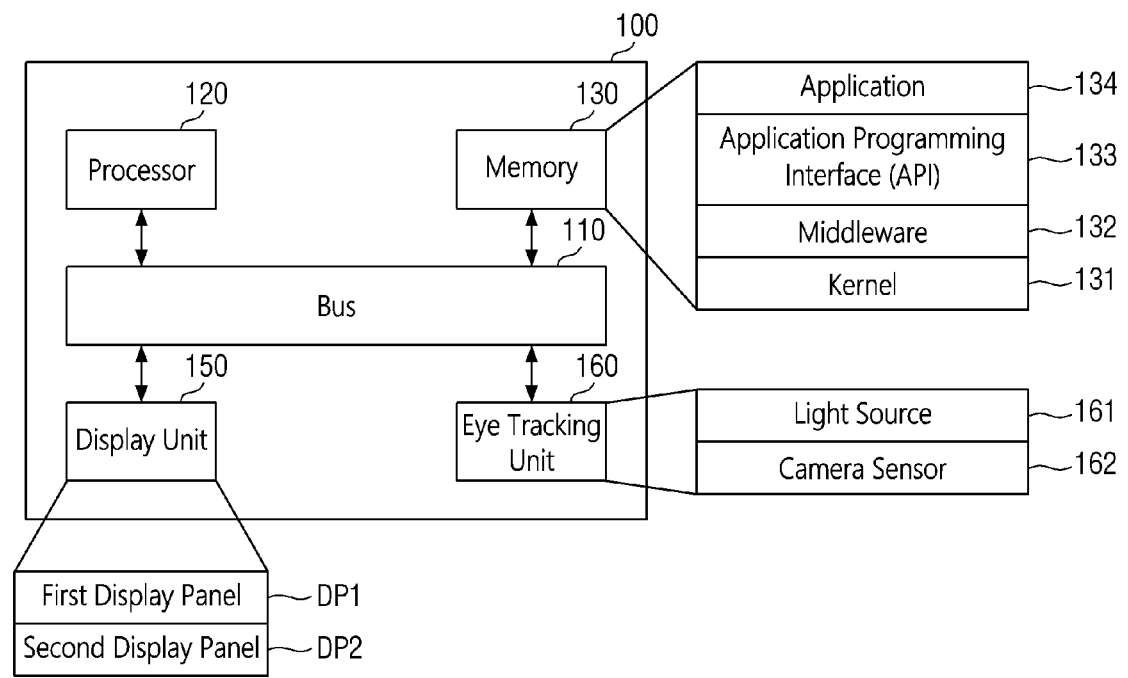
FIG. 3 is a schematic block diagram of a display device according to another embodiment.

FIG. 2 is a schematic block diagram of a display device according to one embodiment, and FIG. 3 is a schematic block diagram of a display device according to another embodiment.

Referring to FIG. 2, a display device 100 may include a bus 110, a processor 120, a memory 130, and a display unit 150.

The bus 110 may be a circuit for serving to connect the aforementioned components to each other and carry communications (e.g., control messages) between the aforementioned components.

For example, the processor 120 may receive a request, data, or a signal from the aforementioned other components (e.g., the memory 130, an input/output interface 140, the display unit 150, and the like) through the bus 110, and may perform operations or process the data in response thereto to thereby control the components.

The processor 120 may process at least some of the information obtained from other components (e.g., the memory 130, the display unit 150, an eye tracking unit 160, and the like), and provide the processed information to the user in various ways.

For example, the processor 120 synchronizes an image signal inputted to the first display panel DP1 of the display unit 150 to be described below with an image signal inputted to the second display panel DP2. In addition, the processor 120 cuts out an image corresponding to foveal vision from the entire image, and provides the cut-out image to the second display panel DP2. The second display panel DP2 displays the cut-out image corresponding to the foveal vision. Here, the foveal vision refers to the vision of the fovea and the vicinity thereof. Peripheral vision to be described later refers to the vision corresponding to the outside of the foveal vision. Accordingly, interference between a first display image displayed on the first display panel DP1 and a second display image displayed on the second display panel DP2 is prevented. Further, the processor 120 performs rendering of the first display image displayed on the first display panel DP1 and the second display image displayed on the second display panel DP2. Accordingly, the first display image displayed on the first display panel DP1 and the second display image displayed on the second display panel DP2 are displayed as one complete VR image.

The memory 130 may store therein commands or data received from or generated by the processor 120 or other components (e.g., the input/output interface 140, the display unit 150, the eye tracking unit 160, and the like). The memory 130 may include, by way of example, programming modules such as a kernel 131, middleware 132, an application programming interface ("API") 133, an application 134, and the like. Each of the aforementioned programming modules may be composed of software, firmware, hardware, or a combination of at least two of them.

The kernel 131 may control or manage system resources (e.g., the bus 110, the processor 120, the memory 130, and the like) used to perform operations or functions implemented in the remaining programming modules, such as the middleware 132, the API 133, and the application 134. In addition, the kernel 131 may provide an interface through which the middleware 132, the API 133, or the application 134 can access the individual component of the display device 100 to control or manage it.

The middleware 132 may serve as an intermediary so that the API 133 or the application 134 may communicate with the kernel 131 to transmit or receive data. Furthermore, the middleware 132 may perform a control (for example, scheduling or load balancing) on work requests received from the application 134 by using a method of, for example, allocating priority for using the system resource (e.g., the bus 110, the processor 120, or the memory 130) of the display device 100 to at least one application of the application 134.

The API 133 is an interface for allowing the application 134 to control functions provided by the kernel 131 or the middleware 132, and may include, by way of example, at least one interface or function (e.g., a command) for file control, window control, image processing, character control, or the like.

According to various embodiments, the application 134 may include a short message/messaging service or multimedia messaging service (SMS/MMS) application, an email application, a calendar application, an alarm application, a healthcare application (e.g., an application for measuring momentum, blood sugar, or the like), an environment information application (e.g., an application for providing air pressure, humidity, or temperature information), or the like.

The display unit 150 (or a display module) may display various types of information (e.g., multimedia data or text data) to the user. By way of example, the display unit 150 may include a display panel (e.g., a liquid crystal display (LCD) panel or an organic light-emitting diode (OLED) panel) and a display driver IC ("DDI"). The DDI may adjust pixels of the display panel to display a color. For example, the DDI may include a circuit that serves to convert a digital signal into an RGB analog value and transmit it to the display panel.

According to one embodiment, the display unit 150 may include the first display panel DP1 and the second display panel DP2. The first display panel may include an organic light emitting diode (OLED) panel, but is not limited thereto. The second display panel DP2 may include, but not limited to, an organic light emitting diodes on silicone (OLEDoS) panel or a light emitting diodes on silicone ("LEDoS") panel.

The OLED panel, the OLEDoS panel or the LEDoS panel may include a panel circuit for implementing colors of pixel areas (or pixels). The panel circuit includes an array of a number of OLED light emitting elements arranged on a screen, and each of the OLED light emitting elements may form a pixel. The OLED light emitting element has a structure in which an organic light emitting material is deposited between a cathode electrode and an anode electrode. A current flows through the organic light emitting material between the two electrodes, and the organic light emitting material may emit light using an electroluminescence phenomenon.

The OLED panel, the OLEDoS panel, or the LEDoS panel may implement colors by using a three-color (red, green, blue) independent pixel method, a color conversion method ("CCM"), or a color filter method. By way of example, the OLED panel, the OLEDoS panel, or the LEDoS panel may express a dot (a unit representing one color) through a combination of OLED light emitting elements having three colors (red, green, and blue).

The OLED panel, the OLEDoS panel or the LEDoS panel may be either a passive matrix organic light emitting diodes ("PMOLED") panel or an active-matrix organic light emitting diodes ("AMOLED") panel. For example, the AMOLED panel may incorporate a thin film transistor ("TFT") for each AMOLED light emitting element to individually control whether each AMOLED light emitting element emits light. Here, when a voltage in a forward direction is applied to the thin film transistor, the current flows to the organic light emitting material at a voltage equal to or larger than a predetermined threshold voltage, and the organic light emitting material may emit light. Here, as the current flowing to the organic light emitting material increases, the organic light emitting material may emit brighter light. On the contrary, when a voltage in a backward direction is applied to the thin film transistor, the current hardly flows to the organic light emitting material, and the organic light emitting material cannot emit light.

The OLED panel may include a multiple number of pixel areas and a black matrix area. Each of the multiple number of pixel areas may be a minimum unit for forming an image. The multiple number of pixel areas may generally have the same shape and may be regularly arranged side by side in a row direction (e.g., the X-axis direction) or a column direction (e.g., the Y-axis direction), but are not limited thereto. One dot, which is a unit representing one color, may constitute a pixel group including pixel areas (e.g., a red pixel area, a green pixel area, and a blue pixel area) capable of emitting light of three colors (red, green, and blue). The pixel group (e.g., the three pixel areas) may be repeatedly arranged in a row direction (e.g., the X-axis direction) or in a column direction (e.g., the Y-axis direction). Further, the pixel group is not limited to the three pixel areas, and may include a larger number of pixel areas. The above-described organic light emitting material may be disposed in the pixel areas. The black matrix area is separated from the pixel areas, and may distinguish the pixel areas. For example, the black matrix area may include a black matrix of a color filter, or may include a separator that separates AMOLED light emitting elements from each other. At least a part of the above-described thin film transistor and relevant circuits (e.g., OLED panel circuits for implementing the colors of the pixels) may be disposed in the black matrix area.

Referring to FIG. 3, a display device 200 may further include the eye tracking unit 160.

The eye tracking unit 160 may include a light source 161 and a camera sensor 162. The light source 161 emits an infrared ray, and the camera sensor 162, which is a sensor capable of scanning the infrared ray, records a reflection direction of the infrared ray reflected on the pupil. The eye tracking unit 160 calculates the position of the eyeball or pupil based on the data recorded by the camera sensor 162. Various known gaze tracking mechanisms may be used by the eye tracking unit 160.

In addition, the processor 120 directs the image of the second display panel DP2 toward the center of the user's gaze based on the position or gaze of the pupil detected by the eye tracking unit 160.

For example, the processor 120 synchronizes an image of the first display panel DP1 of the display unit 150 to be described later with an image of the second display panel DP2. In addition, the processor 120 cuts out an image corresponding to the foveal vision from the entire image, and provides the cut-out image to the second display panel. The second display panel displays the cut-out image corresponding to the foveal vision. In addition, the processor 120 provides a remaining image, which is left after the image corresponding to the foveal vision is cut, to the first display panel. Accordingly, the first display image of the first display panel DP1 and the second display image of the second display panel DP2 do not overlap each other in a plan view.

To this end, the display unit 150 of the display device 1 may further include a light steerer and a polarization control member to be described later. The light steerer and the polarization control member to be described later will be described later with reference to FIGS. 15 to 25.

Figure 4:
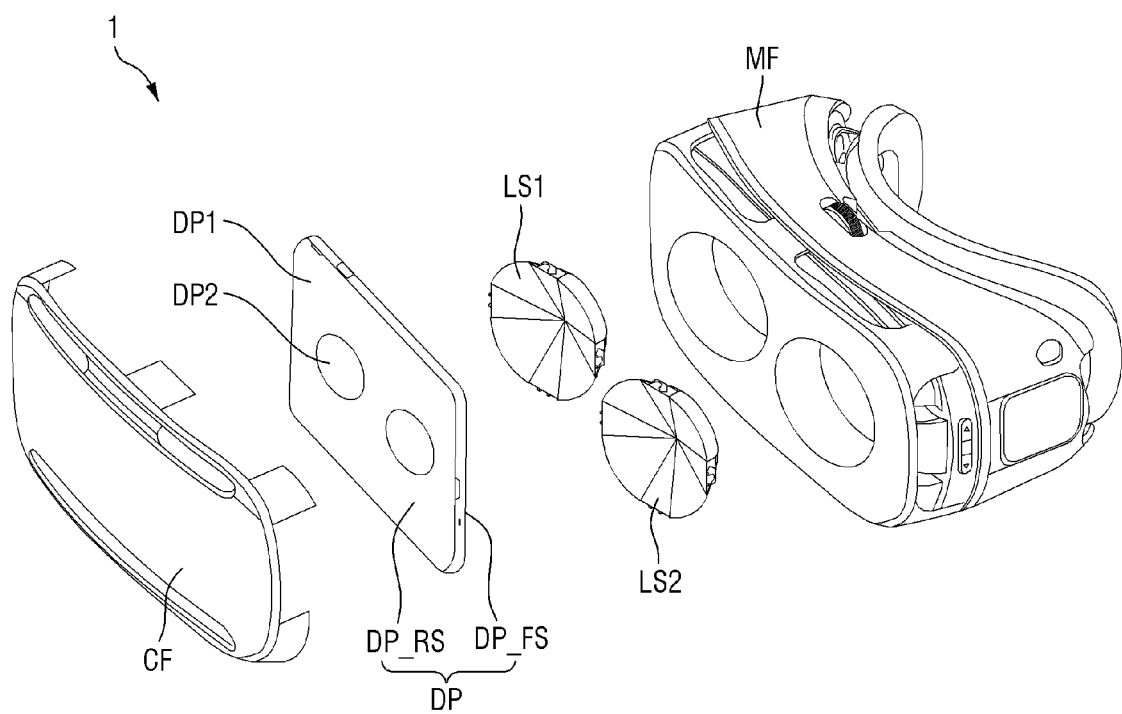
FIG. 4 is an exploded perspective view of a display device according to one embodiment.
Figure 5:
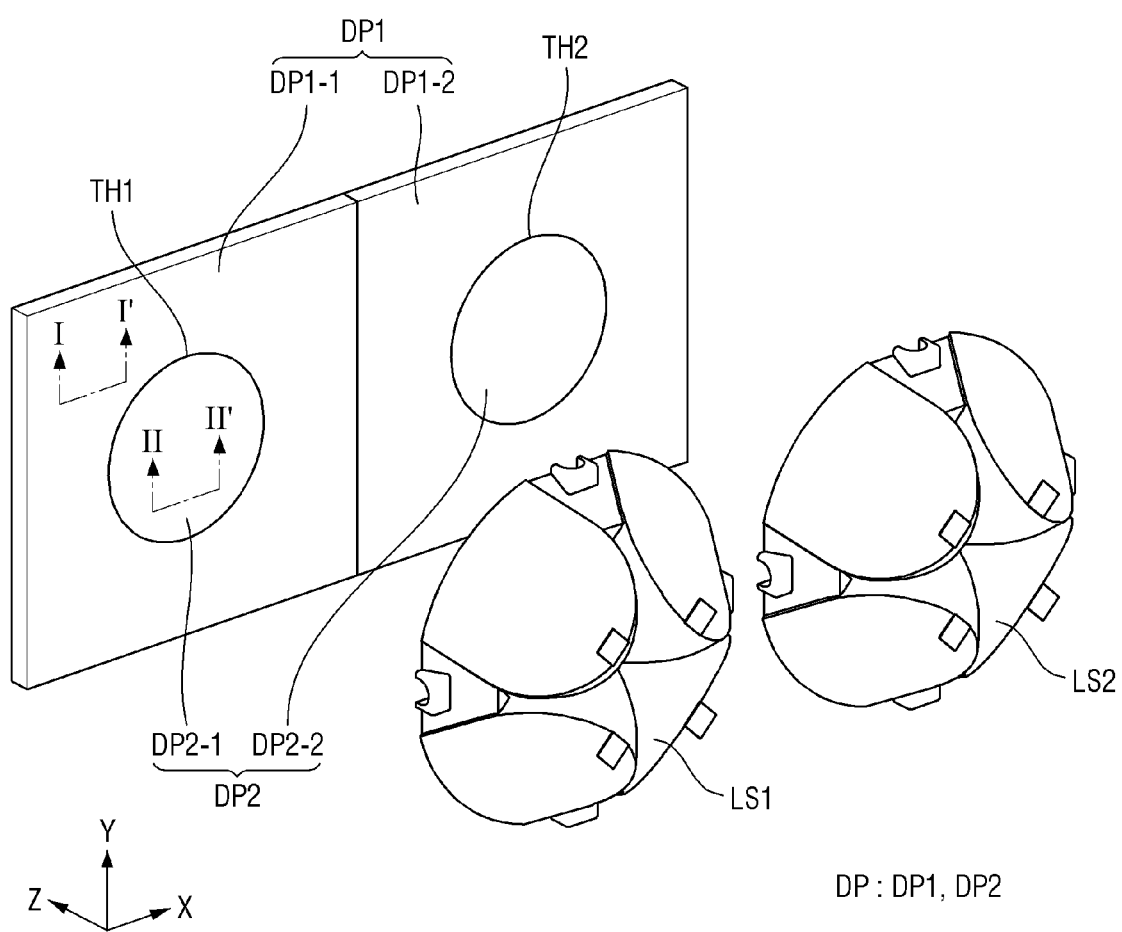
FIG. 5 is an exploded perspective view of a display unit of the display device according to one embodiment.

FIG. 4 is an exploded perspective view of a display device according to one embodiment, and FIG. 5 is an exploded perspective view of a display unit of the display device according to one embodiment.

The following display device 1 may include a head mounted display device mounted on the user's head to provide the user with a screen on which an image or a video is displayed.

The head mounted display device (HMD) may include a see-through type that provides augmented reality (AR) based on actual external objects and a see-closed type that provides virtual reality (VR) to the user on a screen independent from the external objects. Hereinafter, a see-closed type head mounted display device will be described as a non-limiting example.

Referring to FIGS. 4 and 5, the display device 1 may include a main frame MF, a display unit DP, a multi-channel lens LS, and a cover frame CF.

The main frame MF may be worn on the user's face. The main frame MF may have a shape corresponding to the shape of the user's head (face). A first multi-channel lens LS1, a second multi-channel lens LS2, the display unit DP, and the cover frame CF may be mounted to the main frame MF. The main frame MF may include a space or a structure in which the display unit DP, the first multi-channel lens LS1, and the second multi-channel lens LS2 can be accommodated. Although not shown, the main frame MF may further include a structure such as a strap or a band to facilitate the mounting, and a controller, an image processing unit, and a lens accommodating unit may be further mounted on the main frame MF.

The display unit DP displays an image and/or a video. The display unit DP may include a front surface DP_FS on which the image and/or the video are displayed and a rear surface DP_RS opposite to the front surface DP_FS. Light for providing the image and/or the video may be emitted from the front surface DP_FS of the display unit DP. As will be described later, the first multi-channel lens LS1 and the second multi-channel lens LS2 may be disposed on the front surface DP_FS of the display unit DP.

The display unit DP may be fixed to the main frame MF, or may be provided in a detachable manner. The display unit DP may be configured to be opaque, transparent, or translucent according to the design of the display device 1, for example, the type of the display device 1.

The display unit DP may include the first display panel DP1 having a first display area and a second display panel DP2 having a second display area. The first display area may be wider than the second display area. The first display panel DP1 may provide a lower resolution image over a wider field of view, and the second display panel DP2 may provide a higher resolution image over a narrow field of view. The first display panel DP1 may correspond to the peripheral vision, and the second display area may correspond to the foveal vision.

The field of view of the second display panel DP2 is larger than 1°. In one embodiment, the field of view of the second display panel DP2 is between 1° and 20°.

The first display panel DP1 may have a field of view ranging between 200 and 80°.

In an embodiment, the second display panel DP2 may have about twice as many pixels per inch (PPI) as the first display panel DP1. For example, the PPI of the first display panel DP1 is equal to or larger than 1000 ppi, and the PPI of the second display panel DP2 is equal to or larger than 2000 ppi.

The first display panel DP1 may include two sub-display panels: a first sub-display panel DP1-1 and a second sub-display panel DP1-2 corresponding to the left and right eyes, respectively. In addition, the second display panel DP2 may include two sub-display panels: a third sub-display panel DP2-1 and a fourth sub-display panel DP2-2 corresponding to the left and right eyes, respectively.

The second display panel DP2 may be embedded in a central portion of the first display panel DP1. That is, the third sub-display panel DP2-1 and the fourth sub-display panel DP2-2 may be embedded in a central portion of the first sub-display panels DP1-1 and a central portion of the second sub-display panels DP1-2, respectively. The first sub-display panel DP1-1 and the second sub-display panel DP1-2 may define a through-hole TH1 and a through-hole TH2 penetrating the rear surface DP_RS from the front surface DP_FS of the first display panel DP1, respectively. The through-holes TH1 and TH2 may be formed by applying a hole in active area ("HIAA") technique. The third sub-display panel DP2-1 may be embedded in the first through-hole TH1 of the first sub-display panel DP1-1. Thus, the third sub-display panel DP2-1 and the first sub-display panel DP1-1 are disposed on the same plane. The third sub-display panel DP2-1 and the first sub-display panel DP1-1 do not overlap each other in Z-axis direction.

In addition, the fourth sub-display panel DP2-2 may be embedded in the second through-hole TH2 of the second sub-display panel DP1-2. Thus, the fourth sub-display panel DP2-2 and the second sub-display panel DP1-2 are disposed on the same plane. The fourth sub-display panel DP2-2 and the second sub-display panel DP1-2 do not overlap each other in a plan view.

The third sub-display panel DP2-1 has the same center as the first sub-display panel DP1-1, and the fourth sub-display panel DP2-2 has the same center as the second sub-display panel DP1-2.

In one embodiment, the second display panel DP2 each have a circular shape, but is not limited thereto.

In one embodiment, the display device 1 is provided with two display members spaced apart from each other to correspond to the two eyes of the user, respectively, but is not limited thereto. In some embodiments, the first sub-display panel DP1-1 and the second sub-display panel DP1-2 may be replaced by a single display member disposed to overlap the first multi-channel lens LS1 and the second multi-channel lens LS2.

In one embodiment, the first display panel DP1 may be a light emitting display panel including a light emitting element. For example, the first display panel DP1 may be an organic light emitting display panel using an organic light emitting diode including an organic light emitting layer, a micro light emitting diode display panel using a micro LED, a quantum dot light emitting display panel using a quantum dot light emitting diode including a quantum dot light emitting layer, or an inorganic light emitting display panel using an inorganic light emitting element including an inorganic semiconductor. Hereinafter, an organic light emitting display panel will be illustrated as the display panel 300, but the present disclosure is not limited thereto.

In one embodiment, the second display panel DP2 may be a light emitting display panel including a light emitting element. For example, the second display panel DP2 may be an organic light emitting display panel using an organic light emitting diode including an organic light emitting layer, a micro light emitting diode display panel using a micro LED, organic light emitting diodes on silicone using an organic light emitting element on a wafer substrate formed by using a semiconductor process, or light emitting diodes on silicone. Hereinafter, an organic light emitting display panel will be illustrated as the display panel 300, but the present disclosure is not limited thereto. The second display panel DP2 has a higher resolution than the first display panel DP1.

The image displayed by the second display panel DP2 is displayed in an area corresponding to the foveal vision. The image displayed by the first display panel DP1 is displayed in an area corresponding to the peripheral vision.

The first display panel DP1 may emit first light and display the first display image in the first display area corresponding to the peripheral vision. The second display panel DP2 may emit second light and provide the second display image to the second display area corresponding to the foveal vision. To this end, the aforementioned processor synchronizes the first display image of the first display panel DP1 with the second display image of the second display panel DP1. The first display image and the second display image are displayed as one complete VR image. In this case, the second display image corresponding to the foveal vision is displayed at high resolution, so that the user may recognize the entire VR image at the high resolution.

The multi-channel lens LS may allow the light emitted from the display unit DP to pass therethrough to provide the light to the user. The multi-channel lenses LS1 and LS2 may provide a plurality of channels through which the light emitted from the display unit DP passes. The plurality of channels may allow the light emitted from the display unit DP to pass through different paths to provide the light to the user. The light emitted from the display unit DP may be incident on the individual channels, and an enlarged image may be focused on the user's eyes.

The multi-channel lens LS may include the first multi-channel lens LS1 and the second multi-channel lens LS2.

The first multi-channel lens LS1 and the second multi-channel lens LS2 may be disposed on the front surface DP_FS of the first sub-display panel DP1-1 and the second sub-display panel DP1-2. The first multi-channel lens LS1 and the second multi-channel lens LS2 may be arranged on the front surface DP_FS of the first display panel DP1 to correspond to the positions of the left and right eyes of the user, respectively. The first multi-channel lens LS1 and the second multi-channel lens LS2 may be accommodated in the main frame MF.

The first multi-channel lens LS1 and the second multi-channel lens LS2 may reflect and/or refract light for providing the image and/or the video displayed on the display unit DP, and provide the reflected or refracted light to the user. The first multi-channel lens LS1 and the second multi-channel lens LS2 may provide a plurality of channels through which the light emitted from the first display panel DP1 and the second display panel DP2 passes. The plurality of channels may allow the light emitted from the first display panel DP1 and the second display panel DP2 to pass through different paths to provide the light to the user. The lights emitted from the first display panel DP1 and the second display panel DP2 may be incident on the individual channels, and an enlarged image may be focused on the user's eyes. The plurality of channels may be implemented by a plurality of sub-lens (see LS11, LS12, LS13, LS14, LS21, LS22, LS23, and LS24 of FIG. 7) to be described later.

The cover frame CF may be disposed on the rear surface DP_RS of the display unit DP to protect the display unit DP.

As will be described later, the display device 1 may further include the controller for controlling the overall operation of the display device 1.

The controller includes the processor described in FIG. 2, and may control operations of the components of the display device 1 including the display unit (150 of FIG. 2). For example, the controller may perform an operation for displaying the processed image on the display unit 150. The controller may be implemented as a dedicated processor including an embedded processor and/or a general-purpose processor including a central processing unit or an application processor, but is not limited thereto.

Figure 6:
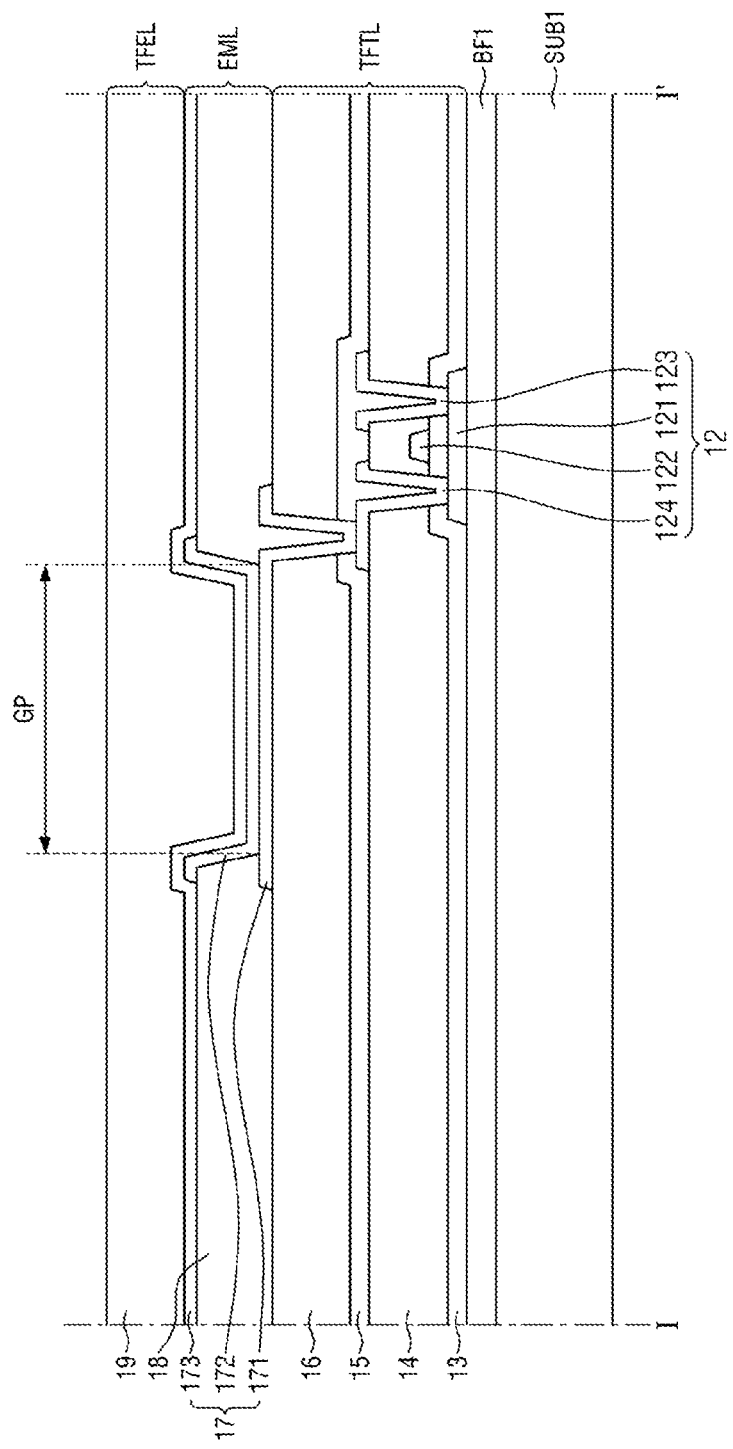
FIG. 6 is a cross-sectional view illustrating an example taken along line I-I' of FIG. 5.

FIG. 6 is a cross-sectional view illustrating an example taken along line I-I' of FIG. 5.

Referring to FIG. 6, the first display panel DP1 includes a substrate SUB1, a thin film transistor layer TFTL disposed on the substrate SUB, a light emitting element layer EML, and a thin film encapsulation layer TFEL.

The substrate SUB1 may be formed of an insulating material such as glass, quartz, or a polymer resin. Examples of a polymer material may include polyethersulphone ("PES"), polyacrylate ("PA"), polyarylate ("PAR"), polyetherimide ("PEI"), polyethylene naphthalate ("PEN"), polyethylene terephthalate ("PET"), polyphenylene sulfide ("PPS"), polyallylate, polyimide ("PI"), polycarbonate ("PC"), cellulose triacetate ("TAC"), cellulose acetate propionate ("CAP"), or a combination thereof. Alternatively, the substrate SUB1 may include a metal material.

The thin film transistor layer TFTL is formed on the substrate SUB1. The thin film transistor layer TFTL includes thin film transistors 12, a gate insulating layer 13, an interlayer insulating layer 14, a passivation layer 15, and a planarization layer 16.

A first buffer layer BF1 may be formed on one surface of the substrate SUB. The first buffer layer BF1 may be formed on one surface of the substrate SUB to protect the thin film transistors 12 and an organic light emitting layer 172 of the light emitting element layer EML from moisture permeating through the substrate SUB susceptible to moisture permeation. The first buffer layer BF1 may be formed of a plurality of inorganic layers that are alternately stacked. For example, the first buffer layer BF1 may be formed of multiple layers in which one or more inorganic layers of a silicon nitride layer, a silicon oxynitride layer, a silicon oxide layer, a titanium oxide layer and an aluminum oxide layer are alternately stacked. The first buffer layer BF1 may be omitted.

The thin film transistor 12 is formed on the first buffer layer BF1. The thin film transistor 12 includes an active layer 121, a gate electrode 122, a source electrode 123, and a drain electrode 124. Although the thin film transistor 12 is illustrated in FIG. 5 to be formed in an upper gate (top gate) structure in which the gate electrode 122 is positioned on the active layer 121, the present disclosure is not limited thereto. That is, the thin film transistors 12 may be formed in a lower gate (bottom gate) structure in which the gate electrode 122 is positioned below the active layer 121 or a double gate structure in which the gate electrode 122 is positioned both above and below the active layer 121.

The active layer 121 is formed on the first buffer layer BF1. The active layer 121 may include polycrystalline silicon, monocrystalline silicon, low-temperature polycrystalline silicon, amorphous silicon, or an oxide semiconductor. For example, the oxide semiconductor may include a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like. For example, the semiconductor layers ACT1 and ACT2. The active layer 121 may include ITZO (an oxide including indium, tin and titanium) or IGZO (an oxide including indium, gallium and tin). A light shielding layer for shielding external light incident on the active layer 121 may be formed between the buffer layer and the active layer 121.

The gate insulating layer 13 may be formed on the active layer 121. The gate insulating layer 13 may be formed of an inorganic layer, for example, a silicon nitride layer, a silicon oxynitride layer, a silicon oxide layer, a titanium oxide layer, or an aluminum oxide layer.

The gate electrode 122 and a gate line may be formed on the gate insulating layer 13. The gate electrode 122 and the gate line may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The interlayer insulating layer 14 may be formed on the gate electrode 122 and the gate line. The interlayer insulating layer 14 may be formed of an inorganic layer, for example, a silicon nitride layer, a silicon oxynitride layer, a silicon oxide layer, a titanium oxide layer, or an aluminum oxide layer.

The source electrode 123 and the drain electrode 124 may be formed on the interlayer insulating layer 14. Each of the source electrode 123 and the drain electrode 124 may be connected to the active layer 121 through a contact hole penetrating the gate insulating layer 13 and the interlayer insulating layer 14. The source electrode 123 and the drain electrode 124 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The passivation layer 15 for insulating the thin film transistor 12 may be formed on the source electrode 213 and the drain electrode 124. The passivation layer 15 may be formed of an inorganic layer, for example, a silicon nitride layer, a silicon oxynitride layer, a silicon oxide layer, a titanium oxide layer, or an aluminum oxide layer.

The planarization layer 16 for flattening a stepped portion formed by the thin film transistors 12 may be formed on the passivation layer 15. The planarization layer 16 may be formed of an organic layer such as acryl resin, epoxy resin, phenolic resin, polyamide resin, polyimide resin and the like.

The light emitting element layer EML is formed on the thin film transistor layer TFTL. The light emitting element layer EML includes light emitting elements 17 and a pixel defining layer 18.

The light emitting elements 17 and the pixel defining layer 18 are formed on the planarization layer 16. Each of the light emitting elements 17 may include a first electrode 171, an organic light emitting layer 172, and a second electrode 173.

The first electrode 171 may be formed on the planarization layer 16. The first electrode 171 is connected to the source electrode 123 of the thin film transistor 12 through a contact hole penetrating the passivation layer 15 and the planarization layer 16.

In a top emission structure in which light is emitted toward the second electrode 173 when viewed with respect to the organic light emitting layer 172, the first electrode 171 may be formed of a metal material having high reflectivity such as a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd) and copper (Cu).

In a bottom emission structure in which light is emitted toward the first electrode 171 when viewed with respect to the organic light emitting layer 172, the first electrode 171 may be formed of a transparent conductive material ("TCO") such as ITO or IZO capable of transmitting light, or a semi-transmissive conductive material such as magnesium (Mg), silver (Ag), or an alloy of magnesium (Mg) and silver (Ag). In this case, when the first electrode 171 is formed of a semi-transmissive metal material, the light emission efficiency can be increased due to a micro-cavity effect.

The pixel defining layer 18 may be formed to partition the first electrode 171 on the planarization layer 16 to serve as a pixel defining layer defining sub-pixels RP, GP, and BP. The pixel defining layer 18 may be formed to cover the edge of the first electrode 171. The pixel defining layer 18 may be formed of an organic layer such as acryl resin, epoxy resin, phenolic resin, polyamide resin, polyimide resin and the like.

Each of the sub-pixels RP, GP, and BP represents a region in which the first electrode 171, the organic light emitting layer 172, and the second electrode 173 are sequentially stacked and holes from the first electrode 171 and electrons from the second electrode 173 are coupled to each other in the organic light emitting layer 172 to emit light. Each of the sub-pixels RP, GP, and BP may include a light emitting element 17.

The organic light emitting layer 172 may be disposed on the first electrode 171 and the pixel defining layer 18. The organic light emitting layer 172 may include an organic material to emit light in a predetermined color. For example, the organic light emitting layer 172 may include a hole transporting layer, an organic material layer, and an electron transporting layer. In this case, the organic light emitting layer 172 of the first sub-pixel RP may emit light of a first color, the organic light emitting layer 172 of the second sub-pixel GP may emit light of a second color, and the organic light emitting layer 172 of the third sub-pixel BP may emit light of a third color. The first color may be red, the second color may be green, and the third color may be blue, but they are not limited thereto.

Alternatively, the organic light emitting layer 172 of each of the sub-pixels RP, GP, and BP may emit white light, in which case the first sub-pixel RP may overlap a color filter layer of the first color, the second sub-pixel GP may overlap a color filter layer of the second color, and the third sub-pixel BP may overlap a color filter layer of the third color.

The second electrode 173 is formed on the organic light emitting layer 172. The second electrode 173 may be formed to cover the organic light emitting layer 172. The second electrode 173 may be a common layer commonly formed on the sub-pixels RP, GP, and BP. A capping layer may be formed on the second electrode 173.

In the top emission structure, the second electrode 173 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). When the second electrode 173 is formed of a semi-transmissive metal material, the light emission efficiency can be increased due to a micro-cavity effect.

In the bottom emission structure, the second electrode 173 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu).

The thin film encapsulation layer TFEL is formed on the light emitting element layer EML. The thin film encapsulation layer TFEL includes an encapsulation layer 19.

The encapsulation layer 19 is disposed on the second electrode 173. The encapsulation layer 19 may include at least one inorganic layer to prevent oxygen or moisture from permeating into the organic light emitting layer 172 and the second electrode 173. In addition, the encapsulation layer 19 may include at least one organic layer to protect the light emitting element layer EML from foreign substances such as dust. For example, the encapsulation layer 19 may include a first inorganic layer disposed on the second electrode 173, an organic layer disposed on the first inorganic layer, and a second inorganic layer disposed on the organic layer. The first inorganic layer and the second inorganic layer may be formed of a silicon nitride layer, a silicon oxynitride layer, a silicon oxide layer, a titanium oxide layer, or an aluminum oxide layer, but are not limited thereto. The organic layer may be formed of acryl resin, epoxy resin, phenolic resin, polyamide resin, polyimide resin, or the like, but is not limited thereto.

A second buffer layer BF2 is formed on the thin film encapsulation layer TFEL. The second buffer layer BF2 may be formed of a plurality of inorganic layers that are alternately stacked. For example, the second buffer layer BF2 may be formed of multiple layers in which one or more inorganic layers of a silicon nitride layer, a silicon oxynitride layer, a silicon oxide layer, a titanium oxide layer and an aluminum oxide layer are alternately stacked. The second buffer layer BF2 may be omitted.

Figure 7:
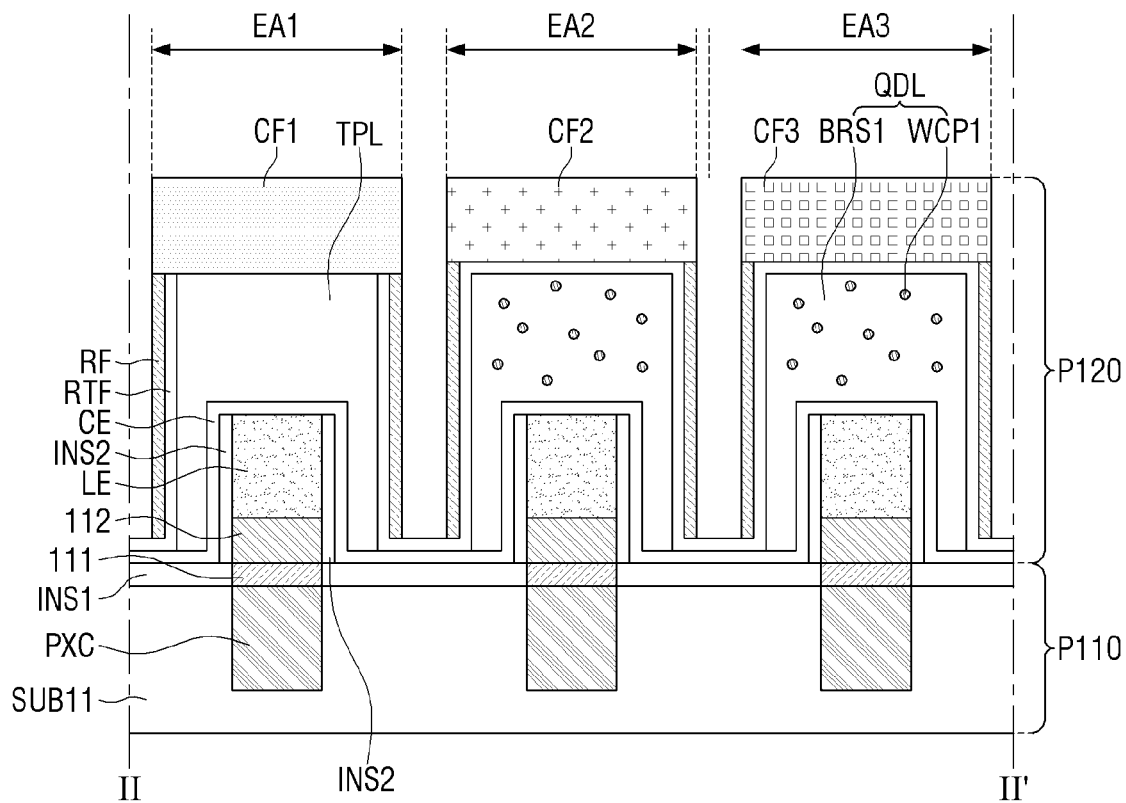
FIG. 7 is a cross-sectional view illustrating an example taken along line II-II' of FIG. 5.

FIG. 7 is a cross-sectional view illustrating an example taken along line II-II' of FIG. 5.

Referring to FIG. 7, the second display panel DP2 may include a semiconductor circuit board P110 and a light emitting element layer P120.

The semiconductor circuit board P110 may include a first substrate SUB11, a plurality of pixel circuit units PXC, pixel electrodes 111, a first pad PD1, a first common connection electrode CCE1 of a common connection electrode CCE, and a first insulating layer INS1.

The first substrate SUB1 may be a silicon wafer substrate. The first substrate SUB1 may be made of monocrystalline silicon.

Each of the plurality of pixel circuits PXC may be disposed on the first substrate SUB11. Each of the plurality of pixel circuit units PXC may include a complementary metal-oxide semiconductor ("CMOS") circuit formed using a semiconductor process. Each of the plurality of pixel circuit units PXC may include at least one transistor formed by the semiconductor process. Further, each of the plurality of pixel circuit units PXC may further include at least one capacitor formed by the semiconductor process.

The plurality of pixel circuit units PXC may be disposed in the second display area. Each of the plurality of pixel circuit units PXC may be connected to the corresponding pixel electrode 111. That is, the plurality of pixel circuit units PXC and the plurality of pixel electrodes 111 may be connected in a one-to-one correspondence. Each of the plurality of pixel circuit units PXC may apply a pixel voltage or an anode voltage to the pixel electrode 111.

Each of the pixel electrodes 111 may be disposed on the corresponding pixel circuit unit PXC. Each of the pixel electrodes 111 may be an exposed electrode exposed from the pixel circuit unit PXC. That is, each of the pixel electrodes 111 may protrude from the top surface of the pixel circuit unit PXC. Each of the pixel electrodes 111 may be integrally formed with the pixel circuit unit PXC. Each of the pixel electrodes 111 may be supplied with a pixel voltage or an anode voltage from the pixel circuit unit PXC. The pixel electrodes 111 may include aluminum (Al).

The first insulating layer INS1 may be disposed on the first substrate SUB11 on which the pixel electrodes 111 are not disposed. The first insulating layer INS1 may be formed of an inorganic layer such as a silicon oxide layer ($SiO_2$), an aluminum oxide layer ($Al_2O_3$), or a hafnium oxide layer (HfOx).

The light emitting element layer P120 may include a plurality of emission areas EA1, EA2, and EA3 to emit light. The light emitting element layer P120 may include connection electrodes 112, light emitting elements LE, a second insulating layer INS2, a common electrode CE, a wavelength conversion layer QDL, a selective reflection layer RTF, a reflection layer RF, and a plurality of color filters CF1, CF2, and CF3.

Each of the connection electrodes 112 may be disposed on the corresponding pixel electrode 111. That is, the connection electrodes 112 may be connected to the pixel electrodes 111 in a one-to-one correspondence. The connection electrodes 112 may serve as a bonding metal for bonding the pixel electrodes 111 and the light-emitting elements LE in a manufacturing process. For example, the connection electrodes 112 may include at least one of gold (Au), copper (Cu), aluminum (Al), and tin (Sn). Alternatively, the connection electrodes 112 may include a first layer including any one of gold (Au), copper (Cu), aluminum (Al), and tin (Sn) and a second layer including another one of gold (Au), copper (Cu), aluminum (Al), and tin (Sn). In this case, the second layer may be disposed on the first layer.

Each of the light emitting elements LE may be disposed on the connection electrode 112. The light emitting element LE may be a vertical light emitting diode element elongated in the third direction DR3. That is, the length of the light emitting element LE in the third direction DR3 may be longer than the length thereof in the horizontal direction. The length in the horizontal direction indicates a length in the first direction DR1 or a length in the second direction DR2. For example, the length of the light emitting element LE in the third direction DR3 may be approximately 1 to 5 μm.

The light emitting element LE may be a micro light emitting diode or a nano light emitting diode. The light emitting element LE includes a first semiconductor layer, an electron blocking layer, an active layer, a superlattice layer, and a second semiconductor layer in the third direction DR3. The first semiconductor layer, the electron blocking layer, the active layer, the superlattice layer, and the second semiconductor layer may be sequentially stacked in the third direction DR3.

The common electrode CE may be disposed on the top surfaces of the light emitting elements LE, the top surface of the first insulating layer INS1, and the top surface of the second insulating layer INS2. The common electrode CE may be disposed to completely cover each of the light emitting elements LE.

The common electrode CE may include a transparent conductive material. For example, the common electrode CE may include transparent conductive oxide (TCO) such as indium tin oxide ("ITO") or indium zinc oxide ("IZO").

A light transmitting layer TPL may be disposed on the common electrode CE in each of the first emission areas EA1. The light transmitting layer TPL may overlap the light emitting element LE in the third direction DR3 in each of the first emission areas EA1. The light transmitting layer TPL may be disposed to completely cover the light emitting element LE in each of the first emission areas EAT.

The light transmitting layer TPL may include a light-transmissive organic material. For example, the light transmitting layer TPL may include epoxy resin, acrylic resin, cardo resin, imide resin, or the like.

The wavelength conversion layer QDL may be disposed on the common electrode CE in each of the second emission areas EA2 and the third emission areas EA3. The wavelength conversion layer QDL may overlap the light emitting element LE in the third direction DR3 in each of the second emission areas EA2 and the third emission areas EA3. The wavelength conversion layer QDL may be disposed to completely cover the light emitting element LE in each of the second emission areas EA2 and the third emission areas EA3.

The wavelength conversion layer QDL may include a first base resin BRS1 and a first wavelength conversion particle WCP1. The first base resin BRS1 may include a transparent organic material. For example, the first base resin BRS1 may contain epoxy resin, acrylic resin, cardo resin, or imide resin.

The first wavelength conversion particle WCP1 may convert the first light emitted from the light emitting element LE into fourth light. For example, the first wavelength conversion particle WCP1 may convert light in a blue wavelength band into light in a yellow wavelength band. The first wavelength conversion particle WCP1 may be a quantum dot ("QD"), a quantum rod, a fluorescent material, or a phosphorescent material. Examples of the quantum dot may include group IV nanocrystal, group II-VI compound nanocrystal, group III-V compound nanocrystal, group IV-VI nanocrystal, and a combination thereof.

The QD may include a core and a shell that overcoats the core. The core may be at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si and Ge, but is not limited thereto. The shell may include at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, but is not limited thereto.

The wavelength conversion layer QDL may further include a scatterer for scattering the light of the light emitting element LE in random directions. In this case, the scatterer may include a metal oxide particle or an organic particle. For example, the metal oxide may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), or tin oxide ($SnO_2$). Further, the organic particle may include acrylic resin or urethane resin. The diameter of the scatterer may be several to several tens of nanometers.

The selective reflection layer RTF may be disposed on the side surfaces of the light transmitting layer TPL in each of the first emission areas EA1, whereas it may be disposed on the top surface and the side surfaces of the wavelength conversion layer QDL in each of the second emission areas EA2 and the third emission areas EA3. The selective reflection layer RTF may be disposed to completely cover the wavelength conversion layer QDL in each of the second emission areas EA2 and the third emission areas EA3. The selective reflection layer RTF may be disposed on the common electrode CE disposed on the first insulating layer INS1.

The selective reflection layer RTF reflects, in first light LT1 emitted from the light emitting element LE in each of the second emission areas EA2 and the third emission area EA3, the first light LT1 not converted by the first wavelength conversion particle WCP1 of the wavelength conversion layer QDL, while transmitting fourth light LT4 converted by the first wavelength conversion particle WCP1. Since the first light LT1 reflected by the selective reflection layer RTF is re-incident on the wavelength conversion layer QDL, it may be converted into the fourth light LT4 by the first wavelength conversion particle WCP1 of the wavelength conversion layer QDL. In addition, since the fourth light LT4 is light in which second light LT2 and third light LT3 are mixed, the second light LT2 may pass through the second color filter CF2. Therefore, due to the selective reflection layer RTF, the efficiency of converting the first light LT1 emitted from the light emitting element LE into the fourth light LT4 by the first wavelength conversion particle WCP1 of the wavelength conversion layer QDL may be increased.

The reflection layer RF may be disposed on the selective reflection layer RTF disposed on the side surfaces of the light transmitting layer TPL and the side surfaces of the wavelength conversion layer QDL. In addition, the reflection layer RF may be disposed on the common electrode CE disposed on the first insulating layer INS1. The reflection layer RF serves to reflect the light traveling in the left and right lateral directions, not in an upward direction, in upper and lower sides, among the lights emitted from the light emitting element LE. The reflection layer RF may include a metal material having high reflectivity, such as aluminum (Al). The thickness of the reflection layer RF may be approximately 0.1 μm.

The plurality of color filters CF1, CF2 and CF3 may include first color filters CF1, second color filters CF2, and third color filters CF3.

Each of the first color filters CF1 may be disposed on the light transmitting layer TPL in the first emission area EA1. Each of the first color filters CF1 may transmit the first light and absorb or block the second light and the third light. For example, each of the first color filters CF1 may transmit light in a blue wavelength band and may absorb or block light in a green and a red wavelength band. Therefore, each of the first color filters CF1 may transmit the first light emitted from the light emitting element LE. That is, the first light emitted from the light emitting element LE in the first emission area EA1 is not converted by a separate wavelength conversion layer, and may penetrate the first color filter CF1 through the light transmitting layer TPL. Accordingly, each of the first emission areas EA1 may emit the first light.

Each of the second color filters CF2 may be disposed on the wavelength conversion layer QDL in the second emission area EA2. Each of the second color filters CF2 may transmit the second light and absorb or block the first light and the third light. For example, each of the second color filters CF2 may transmit light in a green wavelength band and absorb or block light in a blue and a red wavelength band. Therefore, each of the second color filters CF2 may absorb or block, among the first lights emitted from the light emitting element LE, the first light that is not converted by the wavelength conversion layer QDL. In addition, each of the second color filters CF2 may transmit the second light corresponding to the green wavelength band and absorb or block the third light corresponding to the blue wavelength band from the fourth light converted by the wavelength conversion layer QDL. Accordingly, each of the second emission areas EAT may emit the second light.

Each of the third color filters CF3 may be disposed on the wavelength conversion layer QDL in the third emission area EA3. Each of the third color filters CF3 may transmit the third light and absorb or block the first light and the second light. For example, each of the third color filters CF3 may transmit light in a red wavelength band and absorb or block light in a blue and green wavelength band. Therefore, each of the third color filters CF3 may absorb or block, among the first lights emitted from the light emitting element LE, the first light that is not converted by the wavelength conversion layer QDL. In addition, each of the third color filters CF3 may transmit the third light corresponding to the red wavelength band and absorb or block the second light corresponding to the green wavelength band from the fourth light converted by the wavelength conversion layer QDL. Accordingly, each of the third emission areas EA3 may emit the third light.

A black matrix may be disposed between the plurality of color filters CF1, CF2, and CF3. By way of example, the black matrix may be disposed between the first color filter CF1 and the second color filter CF2, between the second color filter CF2 and the third color filter CF3, and between the first color filter CF1 and the third color filter CF3. The black matrix may include an inorganic black pigment such as carbon black or an organic black pigment.

Meanwhile, in order to simplify the manufacturing process, the wavelength conversion layer QDL may be disposed instead of the light transmitting layer TPL in each of the first emission areas EA1 in FIG. 5.

Further, although the description in FIG. 7 has been provided for the case where the display device according to one embodiment is a light emitting diode silicon (LEDoS) display device in which light emitting diode elements are disposed on the substrate SUB11 formed by using the semiconductor process, the embodiment of the present disclosure is not limited thereto.

Figure 8:
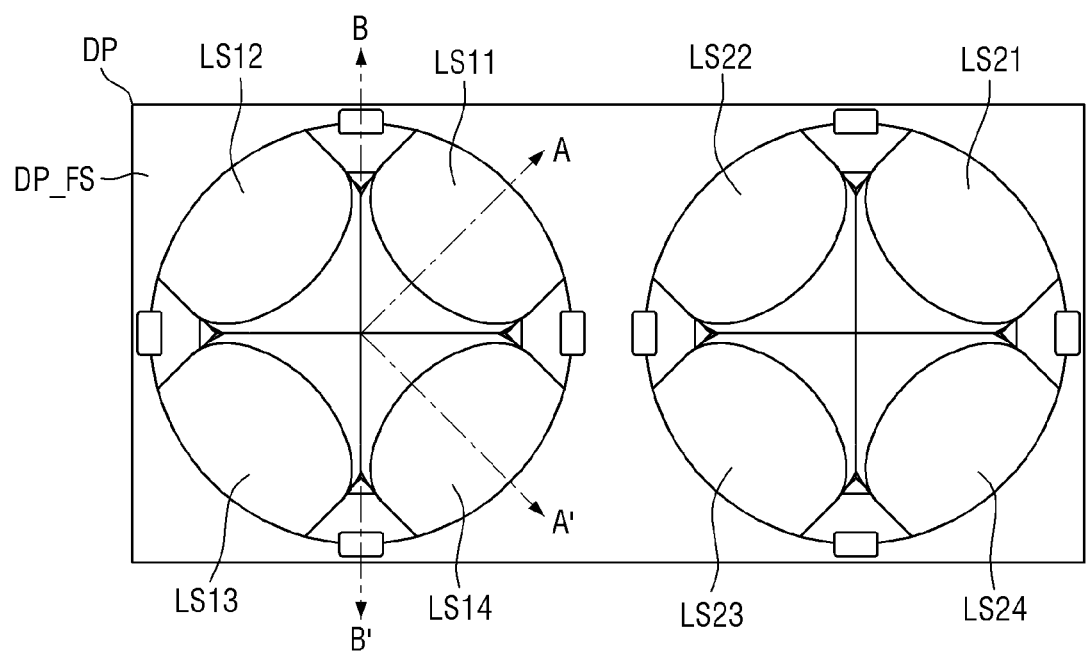
FIG. 8 is a front view illustrating a multi-channel lens disposed on the front surfaces of the display panel and a lens frame shown in FIG. 1.

FIG. 8 is a front view illustrating a multi-channel lens disposed on the front surfaces of the display panel and a lens frame shown in FIG. 1.

Figure 9A:
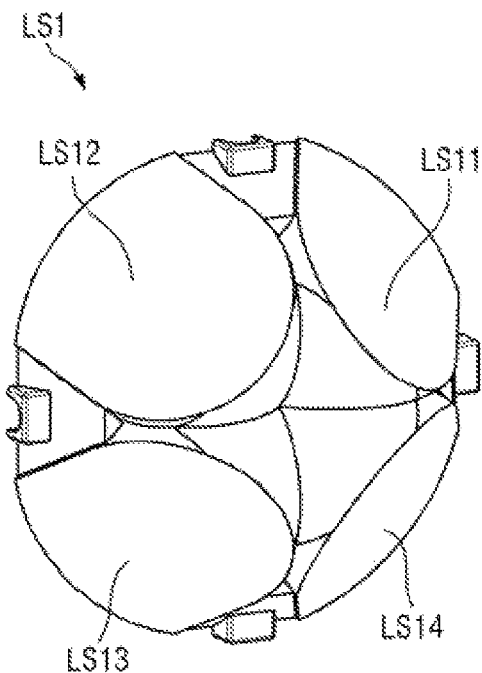
FIGS. 9A and 9B are perspective views respectively illustrating one side and the other side of the multi-channel lens shown in FIG. 8 in detail.
Figure 9B:
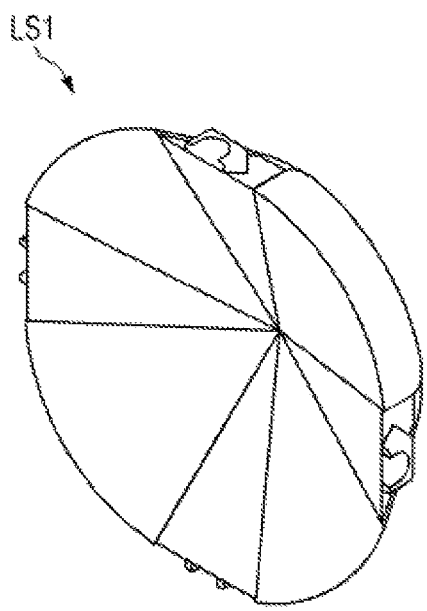

FIGS. 9A and 9B are perspective views respectively illustrating one side and the other side of the multi-channel lens shown in FIG. 8 in detail.

Referring to FIGS. 8, 9A, and 9B, a first multi-channel lens LS1 and a second multi-channel lens LS2 may be disposed on the front surfaces of the first sub-display panel DP1-1 and the second sub-display panel DP1-2, respectively, and may be positioned at points corresponding to the two eyes of the user. For example, the display panel DP may have an approximately rectangular shape elongated in the left and right direction (horizontal direction of FIG. 8) in a plan view.

In one embodiment, the first and second multi-channel lenses LS1 and LS2 are disposed to be symmetrical with respect to the center of the display panel DP, and the first and second multi-channel lenses LS1 and LS2 may have substantially the same or similar structure, but are not limited thereto.

The first and second multi-channel lenses LS1 and LS2 may include a plurality of sub-lenses LS11, LS12, LS13, LS14, LS21, LS22, LS23, and LS24.

In one embodiment, the first multi-channel lens LS1 may include the first sub-lens LS11, the second sub-lens LS12, the third sub-lens LS13, and the fourth sub-lens LS14. The second multi-channel lens LS2 may include the fifth sub-lens LS21, the sixth sub-lens LS22, the seventh sub-lens LS23, and the eighth sub-lens LS24. However, the number of the plurality of sub-lenses LS11, LS12, LS13, LS14, LS21, LS22, LS23, and LS24 is not limited thereto.

In one embodiment, since the second multi-channel lens LS2 is substantially the same as or similar to the first multi-channel lens LS1, the following description will focus on the first multi-channel lens LS2.

The first multi-channel lens LS1 illustrated in FIG. 9 may have a substantially circular shape in a plan view. The first sub-lens LS11, the second sub-lens LS12, the third sub-lens LS13, and the fourth sub-lens LS14 may be disposed in, for example, a clover shape to surround the center of the circular shape of the first multi-channel lens LS1 in a plan view. For example, as illustrated in FIG. 9, the first sub-lens LS11, the second sub-lens LS12, the third sub-lens LS13, and the fourth sub-lens LS14 may be disposed at an upper right end, an upper left end, a lower left end and a lower right end, respectively, with respect to the center of the first multi-channel lens LS1. The first sub-lens LS11, the second sub-lens LS12, the third sub-lens LS13, and the fourth sub-lens LS14 may be integrally connected to each other or may be separated from each other.

More specifically, FIG. 9A is a perspective view illustrating one side of the first multi-channel lens LS1 facing the user's eye. FIG. 9B is a perspective view illustrating the other side of the first multi-channel lens LS1 facing an image displaying surface of the display panel DP.

Referring to FIGS. 9A and 9B, a cross section of the first multi-channel lens LS1 may be formed in an approximately hemispherical shape. In this case, the one side of the first multi-channel lens LS1 facing the main frame MF or the user's eye may be formed in a convex shape, and the other side of the first multi-channel lens LS1 facing the display panel DP may be formed in a concave shape.

Likewise, the second multi-channel lens LS2 may have a substantially hemispherical cross-section, and the fifth sub-lens LS21, the sixth sub-lens LS22, the seventh sub-lens LS23, and the eighth sub-lens LS24 may be disposed in a circular shape or a clover shape surrounding the center of the second multi-channel lens LS2 in a plan view.

Figure 10:
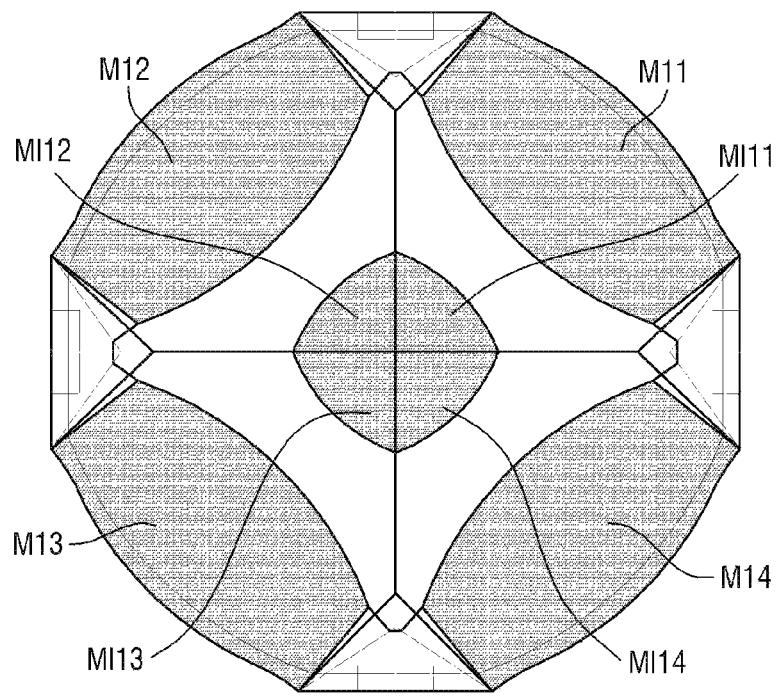
FIG. 10 is a front view illustrating mirror coating regions of the multi-channel lens shown in FIG. 9 in detail.
Figure 11:
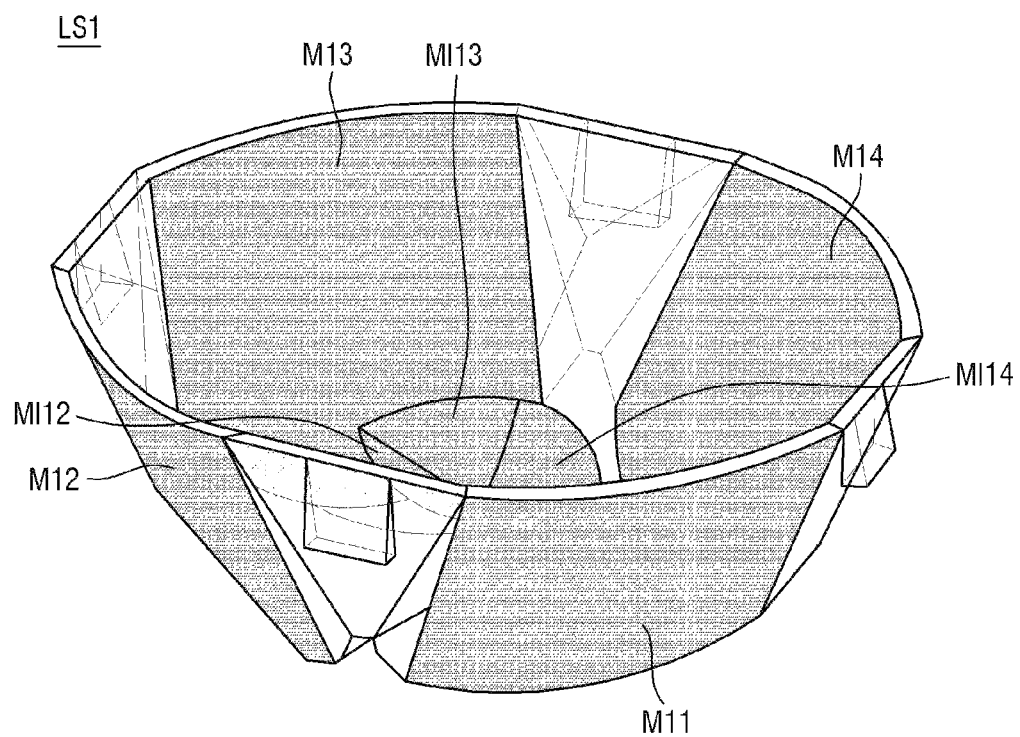
FIG. 11 is a rear perspective view illustrating the mirror coating regions of the multi-channel lens shown in FIG. 9 in detail.

FIG. 10 is a front view illustrating mirror coating regions of the multi-channel lens shown in FIG. 9 in detail. FIG. 11 is a rear perspective view illustrating the mirror coating regions of the multi-channel lens shown in FIG. 9 in detail.

Referring to FIGS. 10 and 11, the front surfaces or the rear surfaces of the first to fourth sub-lenses LS11, LS12, LS13, and LS14 formed in the first multi-channel lens LS1 may be mirror coating regions. Accordingly, a reflective material may be formed or coated on first to fourth mirror coating regions M11, M12, M13, and M14 defined for the first to fourth sub-lenses LS11, LS12, LS13, and LS14, respectively.

The first to fourth mirror coating regions M11, M12, M13, and M14 defined for the first to fourth sub-lenses LS11, LS12, LS13, and LS14, respectively, face a concave portion of the first multi-channel lens LS1, which is the center of the first multi-channel lens LS1. Accordingly, the first to fourth mirror coating regions M11, M12, M13, and M14 may reflect image displaying light, which is incident from the rear surface of the first multi-channel lens LS1, in the direction of the concave portion, which is the center of the first multi-channel lens LS1.

In addition, first to fourth inner coating regions MI11, MI12, MI13, and MI14 facing the first to fourth mirror coating regions M11, M12, M13, and M14 are defined in the concave portion, which is the center of the first multi-channel lens LS1 and is the rear surface of the first multi-channel lens LS1. In addition, the same as the first to fourth mirror coating regions M11, M12, M13, and M14, a reflective material is formed or coated on the first to fourth inner coating regions MI11, MI12, MI13, and MI14. Accordingly, the first to fourth inner coating regions MI11, MI12, MI13, and MI14 may reflect the image displaying light reflected from the first to fourth mirror coating regions MI1, M12, M13, and M14 in the direction of the user's eye, which is the forward direction.

The structure of the first to fourth mirror coating regions M11, M12, M13, and M14 and the first to fourth inner coating regions MI11, MI12, MI13, and MI14 of the first multi-channel lens LS1 is equally applied to the second multi-channel lens LS2.

Figure 12:
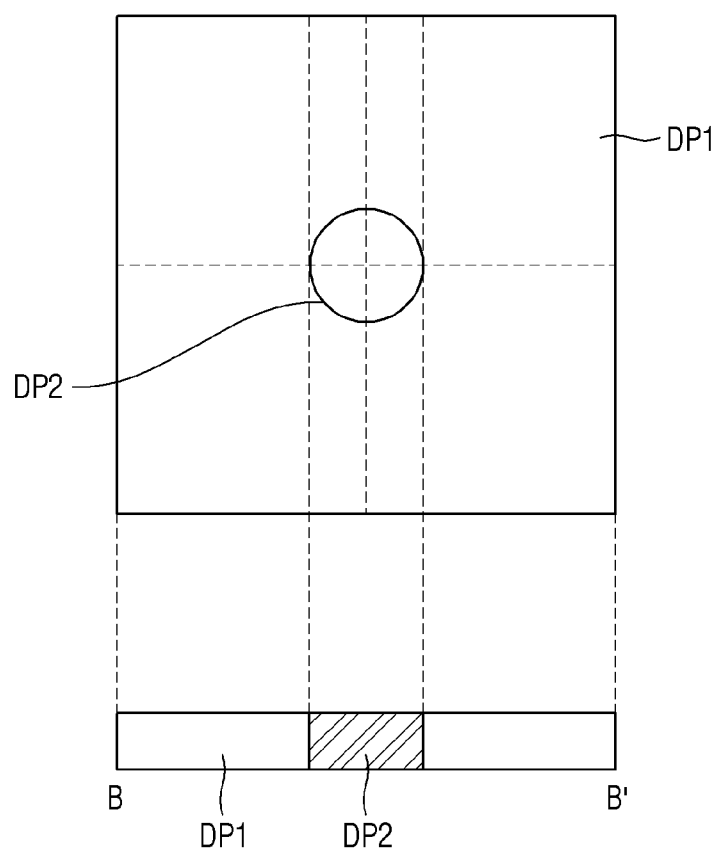
FIG. 12 is a plan view and a cross-sectional view of the display unit taken along line B-B' of FIG. 8.

FIG. 12 is a plan view and a cross-sectional view of the display unit taken along line B-B' of FIG. 8, and FIG. 13A to FIG. 13D are cross-sectional views of the display unit taken along line A-A' of FIG. 8. FIG. 14 is a diagram illustrating the light emitted from FIG. 13A.

Figure 13A:
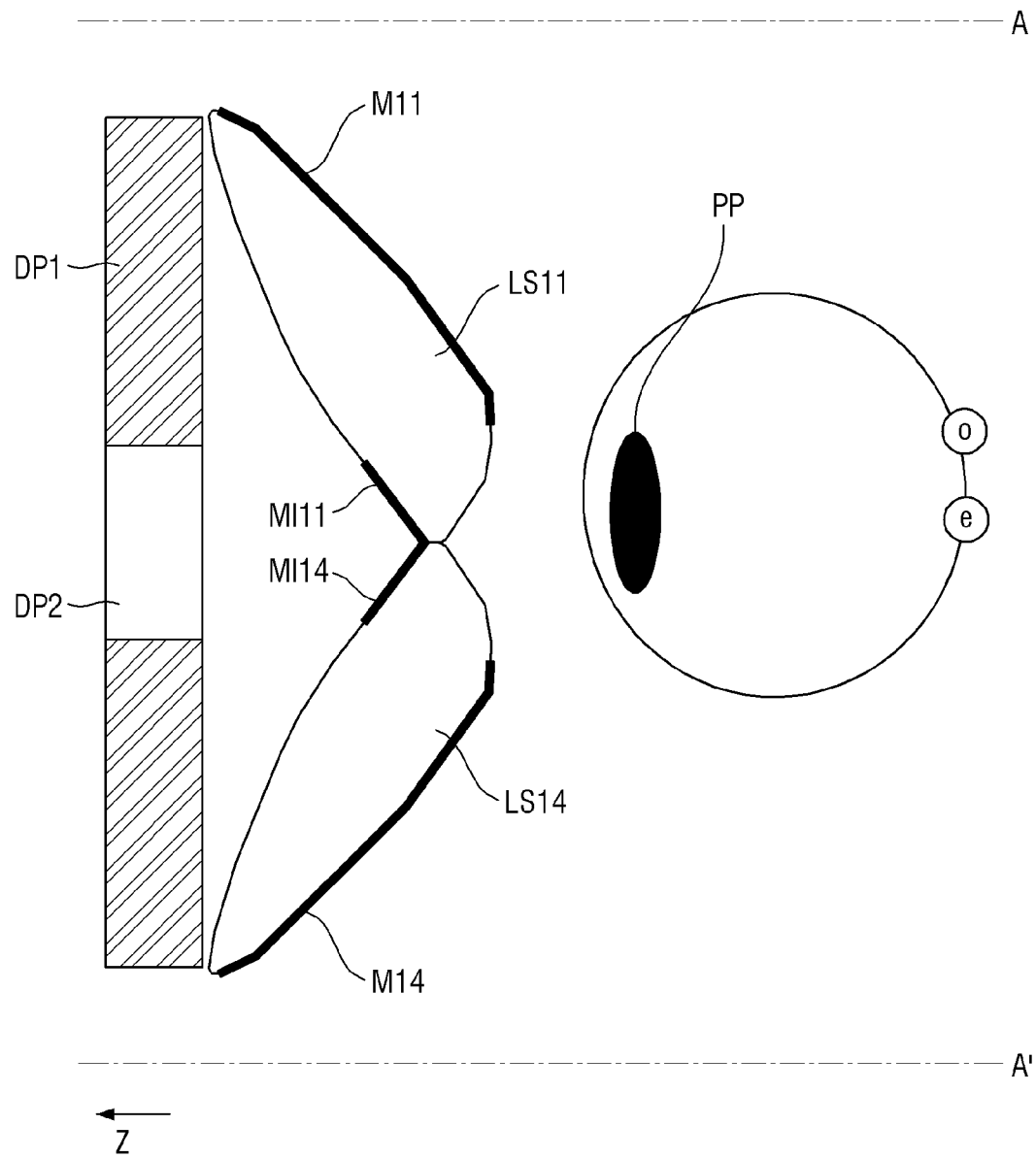
FIG. 13A to FIG. 13D are cross-sectional views of the display unit taken along line A-A' of FIG. 8.
Figure 13B:
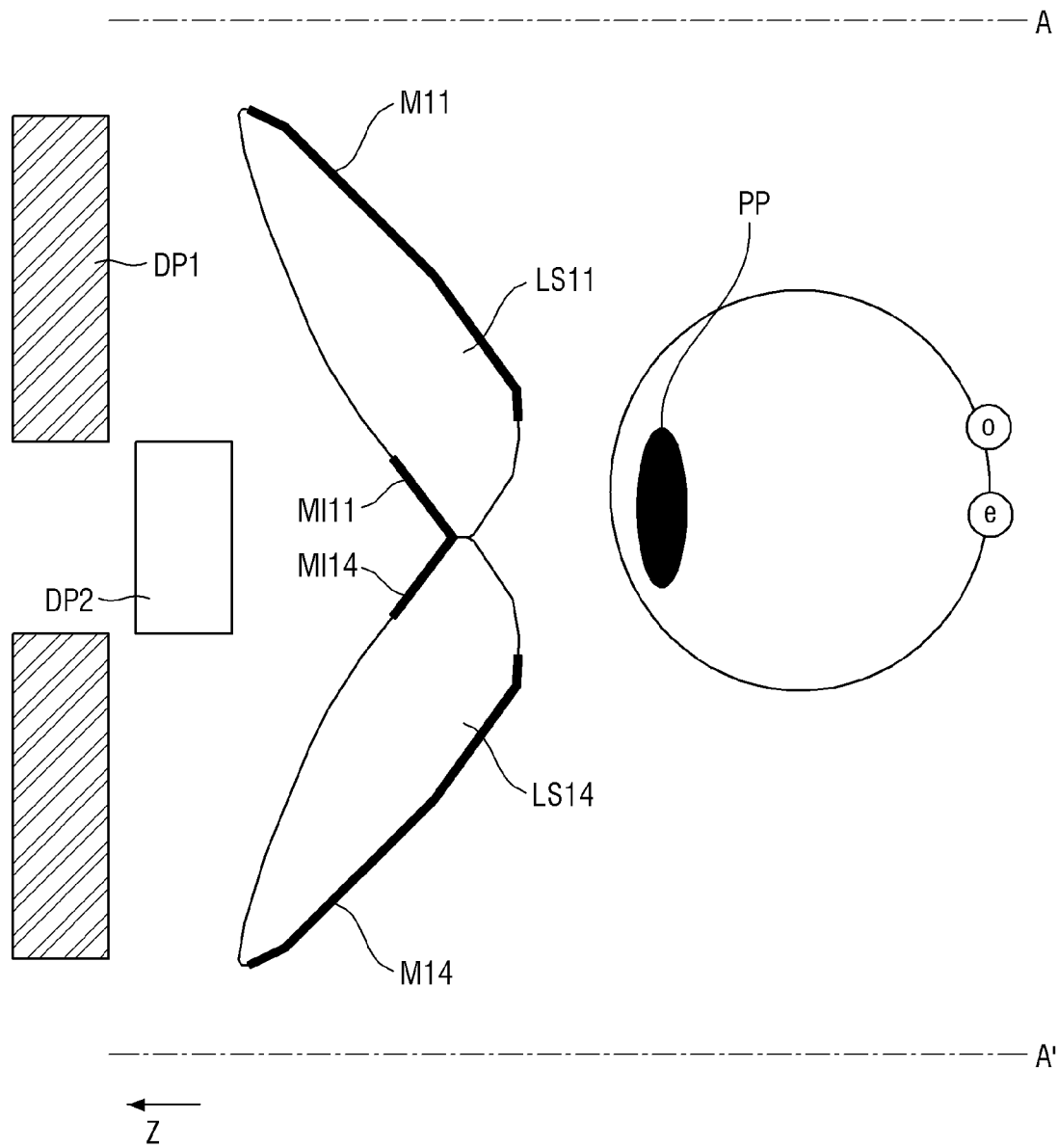
Figure 13C:
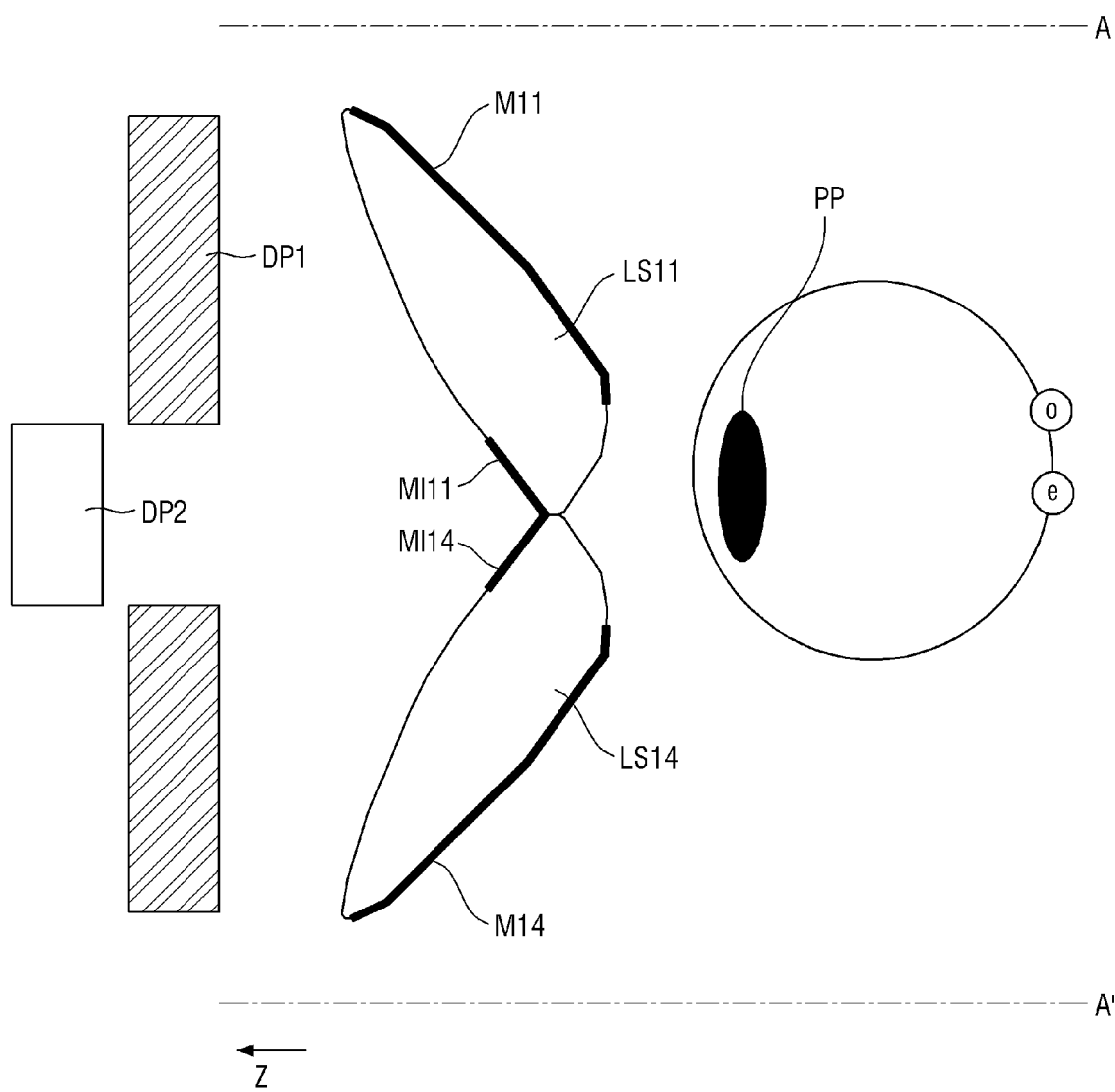
Figure 13D:
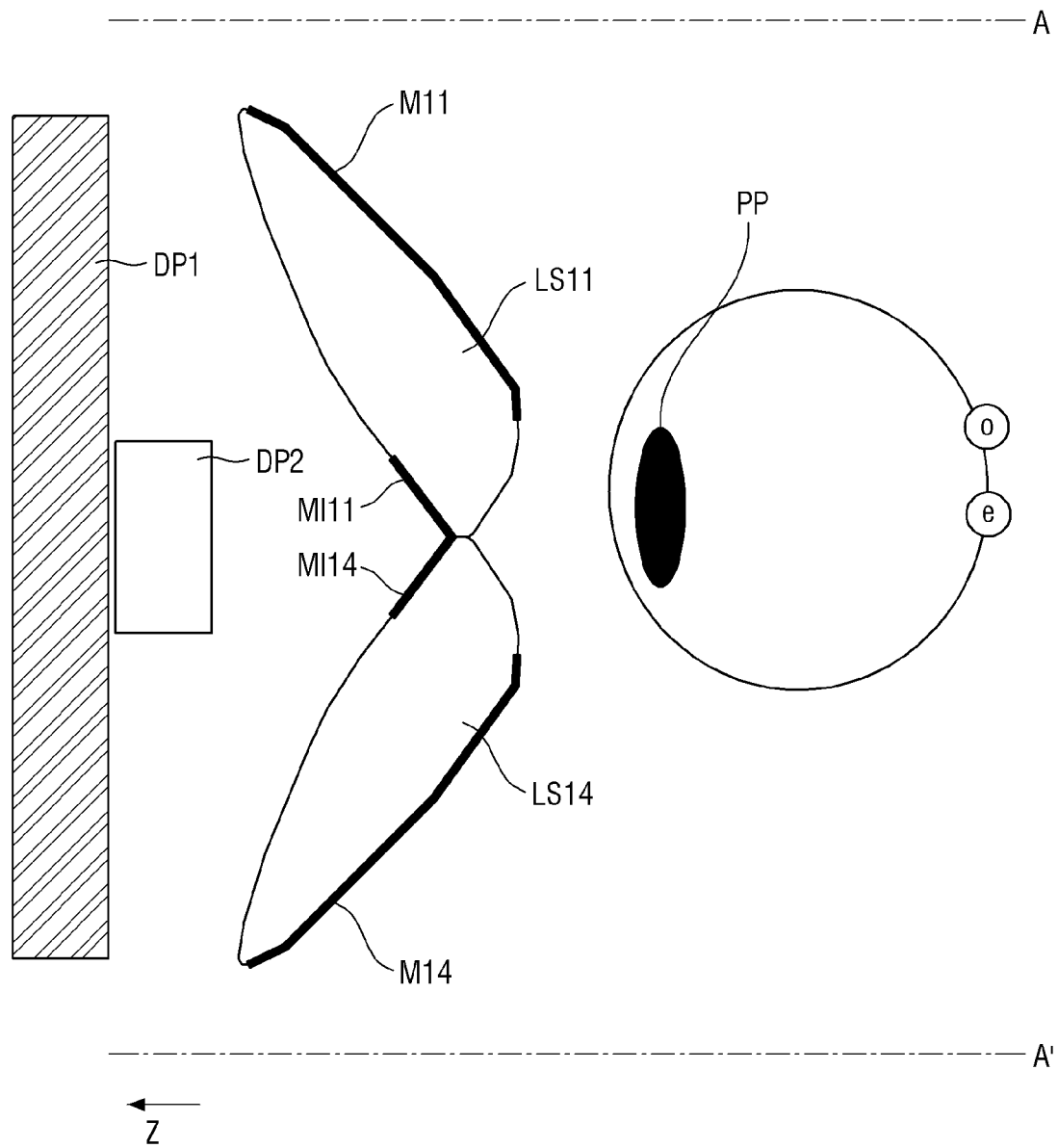
Figure 14:
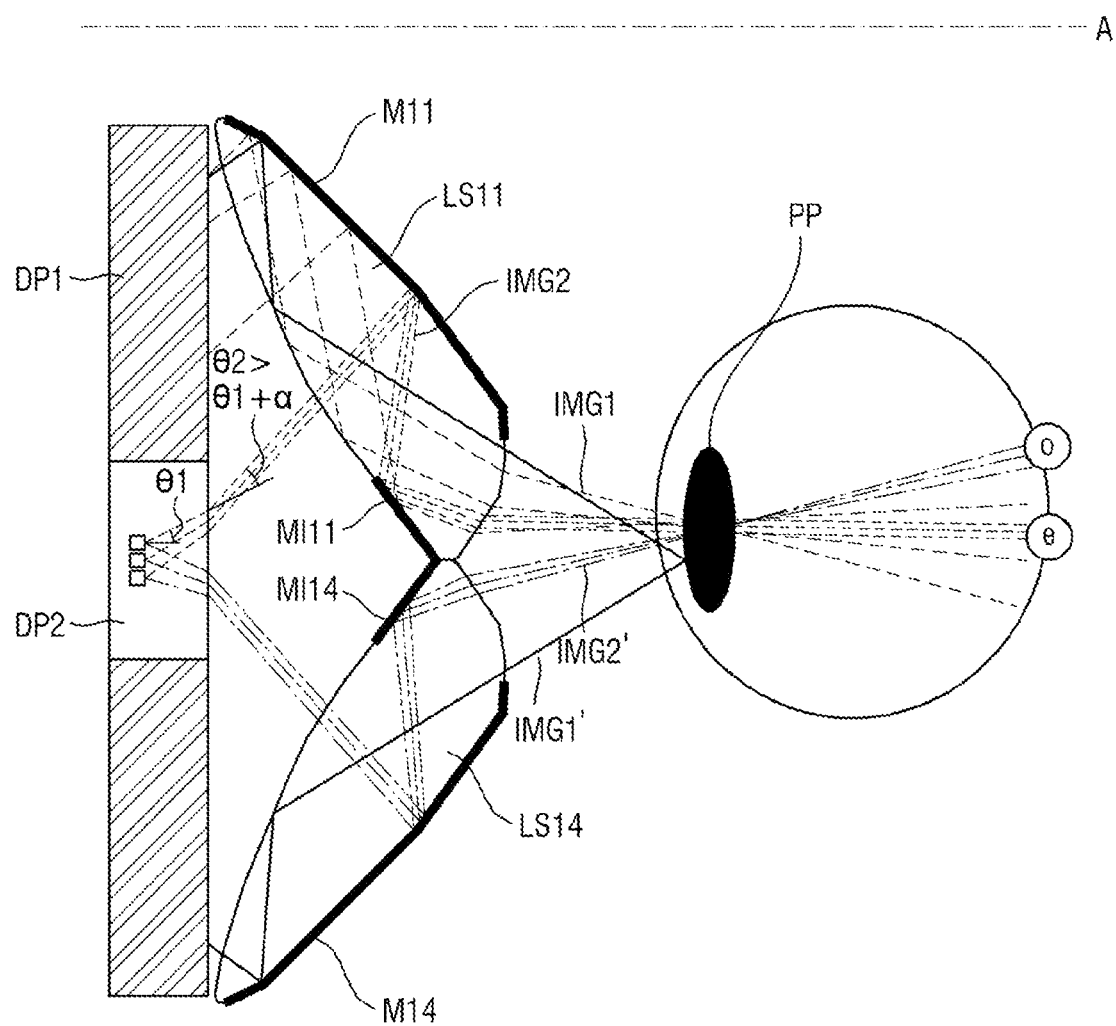
FIG. 14 is a diagram illustrating the light emitted from FIG. 13A.

FIG. 13A is a cross-sectional view illustrating an example in which the second display panel DP2 is embedded in the first display panel DP1, and FIGS. 13B to 13D illustrate modification examples of FIG. 13A, in which the second display panel DP2 may not be embedded in the first display panel DP1 but be arranged in a line with the first display panel DP1.

As shown in FIG. 13B, the second display panel DP2 may be disposed between the first display panel DP1 and the multi-channel lens LS1. The first display panel DP1 may define a through-hole formed in a region overlapping the second display panel DP2 in a plan view. Accordingly, the image of the first display panel DP1 and the image of the second display panel DP2 do not overlap each other in the Z-axis direction.

As shown in FIG. 13C, the second display panel DP2 may be disposed on the rear surface of the first display panel DP1. The first display panel DP1 may define a through-hole formed in a region overlapping the second display panel DP2 in a thickness direction. Accordingly, the image of the first display panel DP1 and the image of the second display panel DP2 do not overlap each other in a thickness direction.

As shown in FIG. 13D, the second display panel DP2 may be disposed between the first display panel DP1 and the multi-channel lens LS1. Accordingly, the processor cuts out the image of the first display panel DP1 overlapping the second display panel DP2 to prevent overlapping of the images.

Referring to FIGS. 5, 8, 12, and 13A to 14, the plurality of sub-lens LS11, LS12, LS13, LS14, LS21, LS22, LS23, and LS24 may provide a plurality of channels through which the light emitted from the front surface DP_FS of the first display panel DP passes. Lights IMG1, IMG1', IMG2 and IMG2' emitted from different regions of the front surface DP_FS of the first display panel DP1 may pass through the channels through different paths. In addition, the first sub-lens LS11 provides a channel through which the light IMG1 emitted from one area (e.g., an upper end of the display panel DP of FIG. 5) of the first sub-display panel DP1-1 and the light IM2 emitted from one area (e.g., an upper end of the display panel DP of FIG. 5) pass. The fourth sub-lens LS14 provides a channel through which the light IMG1' emitted from one area (e.g., a lower end of the display panel DP of FIG. 5) of the first sub-display panel DP1-1 and the light IMG2' emitted from one area (e.g., a lower end of the display panel DP2 of FIG. 5) pass. The one area and the other area of the first sub-display panel DP1-1 and the second sub-display panel DP2-1 may include an area overlapping the first sub-lens L11 and an area overlapping the fourth sub-lens L14, respectively.

Each of the lights IMG1, IMG1', IMG2, and IMG2' may include a partial video and/or a partial image for constructing one complete VR image.

The distance between the first multi-channel lens LS1 and the eyeball may be about 10 mm to 15 mm, but is not limited thereto.

Likewise, although not shown, the second sub-lens L12 and the fourth sub-lens L14 may provide channels through which the lights emitted from different regions of the second sub-display panel DP1-2 and the fourth sub-display panel DP1-4 pass.

In one embodiment, the light passing through each of the sub-lenses L11, L12, L13, L14, L21, L22, L23, and L24 may be provided to the user through two refractions and two reflections, but is not limited thereto.

Referring to FIG. 14, the light IMG2 emitted from the second display panel DP2 is mainly directed toward the center of the field of view of the user's eye. In one embodiment, the field of view (FOV) of the second display panel DP2 is larger than 1°. In one embodiment, a margin a in consideration of a change in the position of the foveal vision due to a movement of the pupil may be added. For example, in one embodiment, the range corresponding to the FOV of the second display panel DP2 may be set to between 1° and 200.

The light IMG1 emitted from the first display panel DP1 is directed toward the peripheral vision that is the outside the foveal vision of the user's eye.

For example, the first display image corresponding to the peripheral vision is displayed by the first lights IMG1 and IMG1' emitted from the first display panel DP1, and the second display image corresponding to the foveal vision is displayed by the second lights IMG2 and IMG2' emitted from the first display panel DP1.

Figure 15:
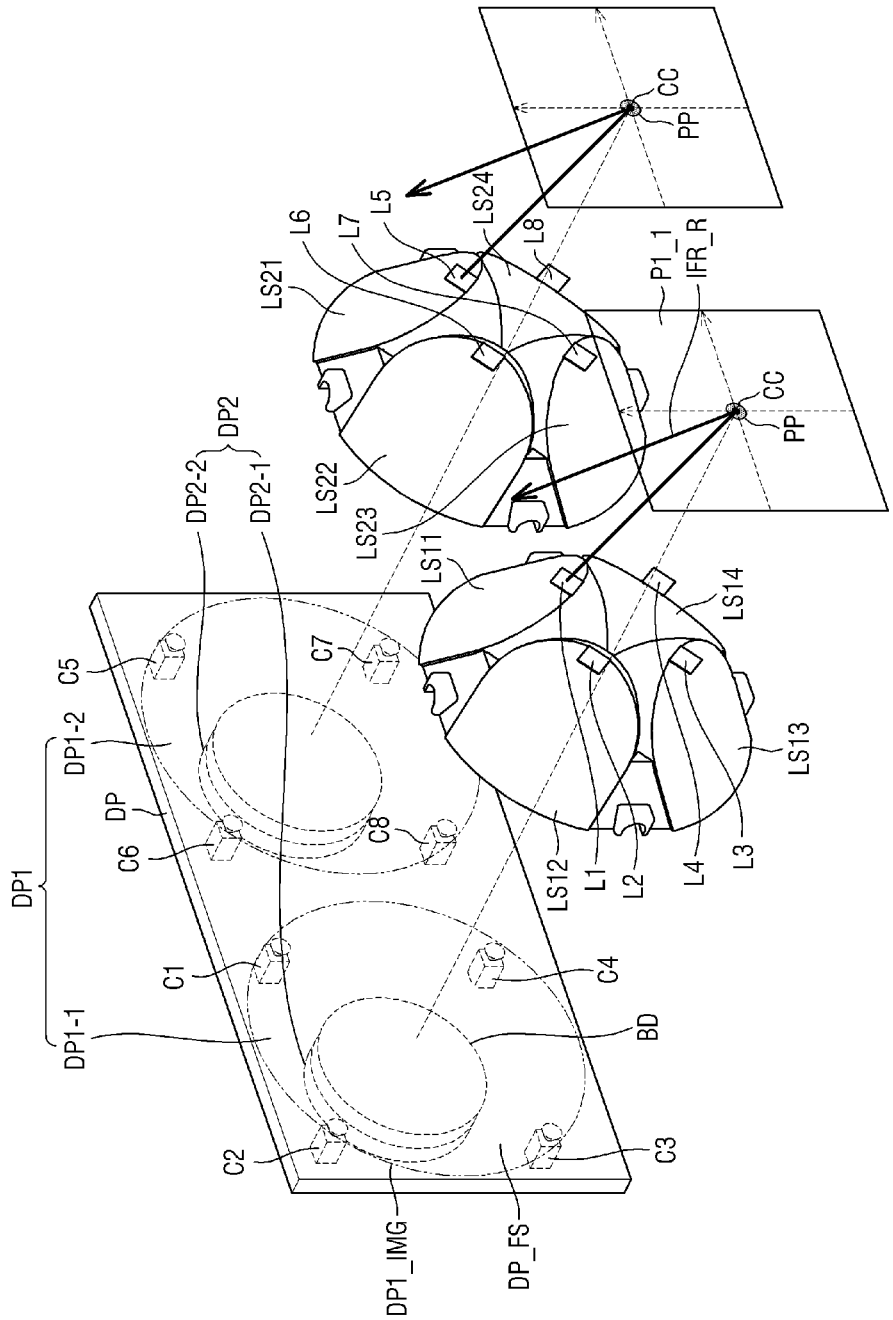
FIG. 15 is an exploded perspective view of a display unit according to another modified example.
Figure 16:
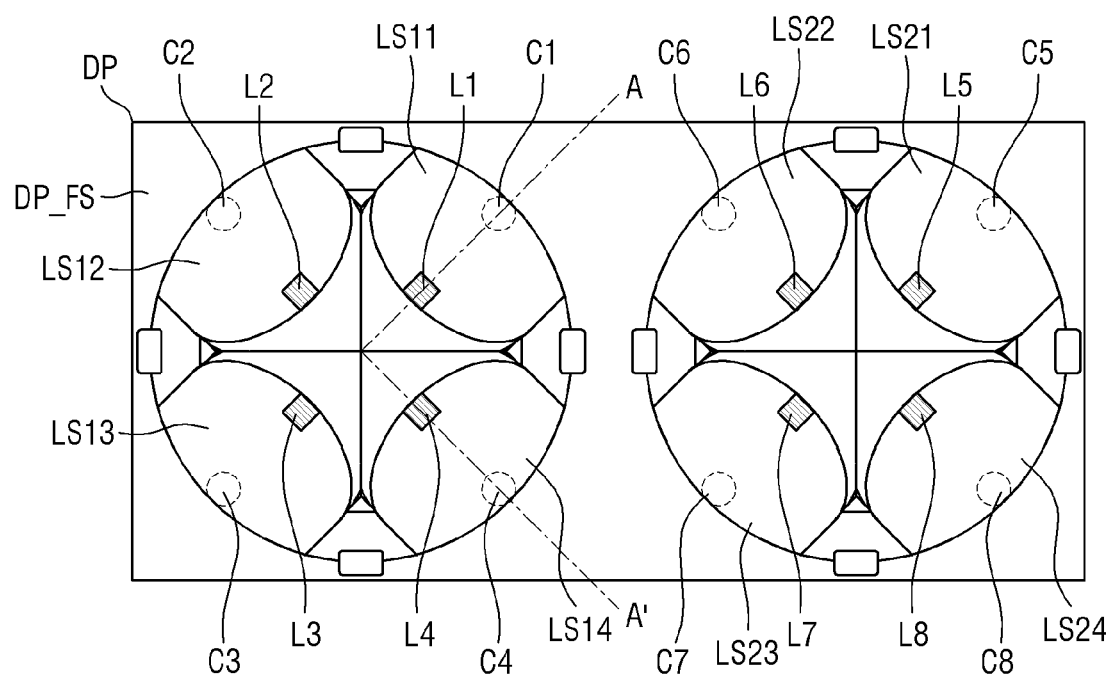
FIG. 16 is a plan view of the display unit of FIG. 15.
Figure 17:
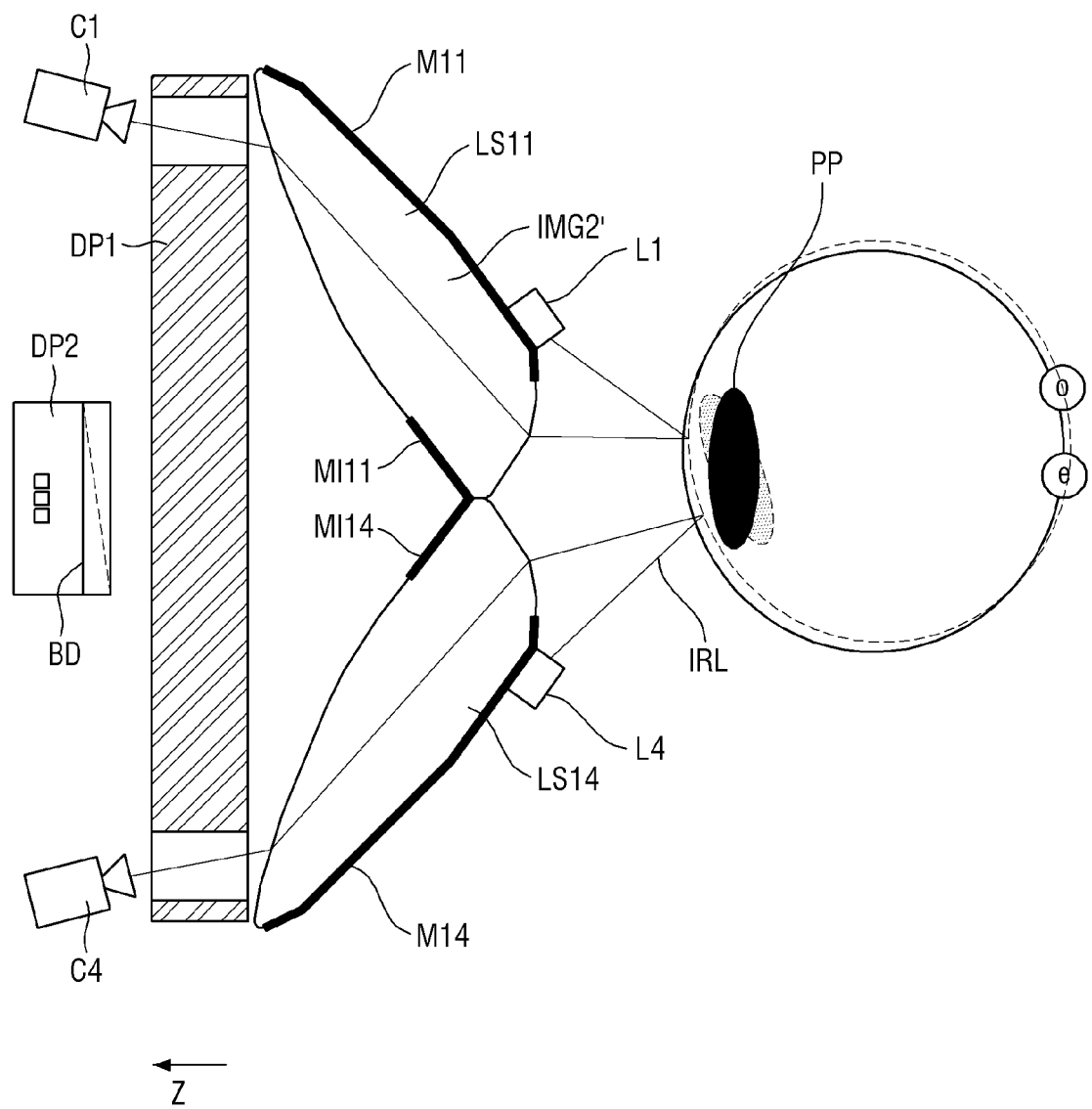
FIG. 17 is a cross-sectional view taken along line A-A' of FIG. 16.
Figure 18:
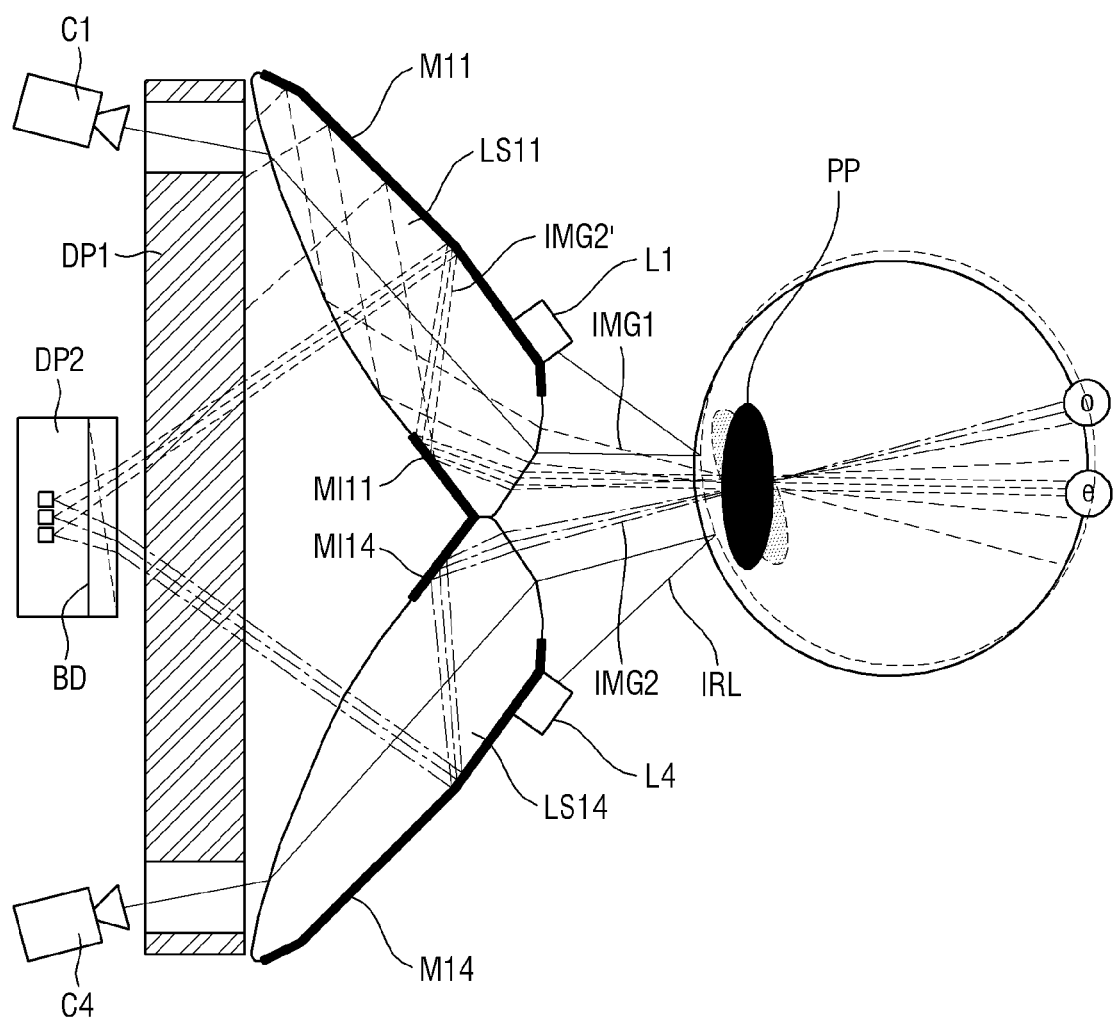
FIG. 18 is a cross-sectional view illustrating the light emitted from the display unit of FIG. 17.

In another modification example, the first display panel DP1 may further include a plurality of regions having different resolutions. For example, a peripheral region of a predetermined area may be defined along the edge of the second display panel DP2. The peripheral region may have a lower resolution than the foveal vision and a higher resolution than the peripheral vision. FIG. 15 is an exploded perspective view of a display unit according to another modified example, FIG. 16 is a plan view of the display unit of FIG. 15, and FIG. 17 is a cross-sectional view taken along line A-A' of FIG. 16. FIG. 18 is a cross-sectional view illustrating the light emitted from the display unit of FIG. 17.

Referring to FIGS. 3, 15 to 17, the display device 100 includes a light steerer BD and the eye tracking unit 160.

The display unit DP may include the first display panel DP1 and the second display panel DP2. The first display panel DP1 may include the two sub-display panels: the first sub-display panel DP1-1 and the second sub-display panel DP1-2 corresponding to the left eye and the right eye, respectively. Further, the second display panel DP2 may include the two third sub-display panels DP2-1 and the fourth sub-display panel DP2-2 corresponding to the left eye and the right eye, respectively.

The second display panel DP2 is disposed on the rear surface of the first display panel DP1. The first display panel DP1 and the second display panel DP2 are disposed to overlap in the thickness direction (i.e., Z-axis direction).

The third sub-display panel DP2-1 is disposed at the center of the rear surface of the first sub-display panel DP1-1, and the fourth sub-display panel DP2-2 is disposed at the center of the rear surface of the second sub-display panel DP1-2.

Here, the first display panel DP1 is a transparent display panel. The substrate of the first display panel DP1 may be formed of a transparent material on a transparent substrate made of glass or the like, and the light emitted from the second display panel DP2 disposed on the rear surface of the first display panel DP1 may penetrate the first display panel DP1. In this case, since the image of the first display panel DP1 and the image of the second display panel DP2 may overlap, the processor described in FIG. 3 defines the position of the second display image corresponding to the foveal vision displayed by the second display panel DP2 in the entire image, and provides image information for cutting out the defined position of the second display image. The display unit displays, on the first display panel DP1, the first display image including the cutout based on the cut-out image information of the first display panel DP1. That is, the first display image is an image in which an area overlapping the display image of the second display panel is cut out. Accordingly, the first display image and the second display image do not overlap each other in a plan view. In addition, the processor synchronizes the first display image displayed by the first display panel DP1 and the second display image displayed by the second display panel DP2 and performs rendering thereof, thus providing one complete image.

The display device 100 may further include an eye tracking unit (160 of FIG. 3). The eye tracking unit 160 may track the user's pupil or gaze vector. In one embodiment, the eye tracking unit 160 may be camera-based. For example, the eye tracking unit 160 may be an infrared scanning camera sensor. In other embodiments, other eye tracking mechanisms may be used. The eye tracking unit 160 may calculate the center of the user's field of view based on the scanned data.

In one embodiment, the eye tracking unit 160 may be disposed at one side of each of the first multi-channel lens LS1 and the second multi-channel lens LS2 facing the main frame MF (the user's eyeball), but is not limited thereto.

The controller includes the processor described above in FIG. 3, and the processor may control the operations of the components of the display device including the display unit 150 and the eye tracking unit 160. The controller may perform an analysis of the image acquired by the eye tracking unit 160 and an operation for tracking the positions of the user's pupil and foveal vision.

Referring to FIGS. 15 to 18, the eye tracking unit 160 may include one or more infrared cameras and one or more light sources.

A plurality of infrared cameras (see C1, C2, C3, C4, C5, C6, C7, and C8 of FIGS. 15 and 16) may be interposed between the cover frame CF and the display unit DP, but are not limited thereto. For example, the infrared cameras may be disposed on the outer side of the multi-channel lens or on the display panel DP.

The controller may control an operation of at least one of a plurality of infrared light sources (see L1, L2, L3, L4, L5, L6, L7, and L8 of FIG. 15) and the plurality of infrared cameras (see C1, C2, C3, C4, C5, C6, C7, and C8 of FIGS. 15 and 16). The controller may perform operations for the analysis of images obtained by the infrared cameras (see C1, C2, C3, C4, C5, C6, C7, and C8 of FIGS. 15 and 16), calculation of the position of the user's pupil PP, image processing (image mapping) based on those images, and display of the processed images on the display panel DP, and the like. The controller may be implemented as a dedicated processor including an embedded processor and/or a general-purpose processor including a central processing unit or an application processor, but is not limited thereto.

The plurality of infrared light sources L1, L2, L3, L4, L5, L6, L7, and L8 may be disposed in the first multi-channel lens LS1 and the second multi-channel lens LS2. The plurality of infrared light sources L1, L2, L3, L4, L5, L6, L7, and L8 may be disposed on one convex side of the first multi-channel lens LS1 and one convex side of the second multi-channel lens LS2 facing the main frame MF (e.g., the user's eye).

The plurality of infrared light sources L1, L2, L3, L4, L5, L6, L7, and L8 may include the first infrared light source L1, the second infrared light source L2, the third infrared light source L3, the fourth infrared light source L4, the fifth infrared light source L5, the sixth infrared light source L6, the seventh infrared light source L7, and the eighth infrared light source L8.

The first infrared light source L1, the second infrared light source L2, the third infrared light source L3, the fourth infrared light source L4, the fifth infrared light source L5, the sixth infrared light source L6, the seventh infrared light source L7, and the eighth infrared light source L8 may be disposed at the first sub-lens LS11, the second sub-lens L12, the third sub-lens L13, the fourth sub-lens LS14, the fifth sub-lens L21, the sixth sub-lens L22, the seventh sub-lens L23, and the eighth sub-lens L24, respectively.

In a plan view, the first infrared light source L1, the second infrared light source L2, the third infrared light source L3, and the fourth infrared light source L4 may be located inside with respect to the boundary of the first multi-channel lens LS1 and disposed to surround the center of the first multi-channel lens LS1, and the fifth infrared light source L5, the sixth infrared light source L6, the seventh infrared light source L7, and the eighth infrared light source L8 may also be located inside with respect to the boundary of the second multi-channel lens LS2 and disposed to surround the center of the multi-channel lens LS2. However, the present disclosure is not limited thereto.

Referring to FIGS. 16 to 18, the plurality of infrared light sources L1, L2, L3, L4, L5, L6, L7, and L8 may be disposed on the inclined surfaces of the sub-lenses extending from the display unit DP in the direction in which the user's eyeball is positioned, but are not limited thereto.

In the following, a thickness direction may imply the thickness direction of the display unit DP (i.e., Z-axis direction) and/or the optical axis direction of the multi-channel lens LS.

In one embodiment, the infrared cameras C1, C2, C3, C4, C5, C6, C7, and C8 are exemplified as a means for detecting the position of the user's pupil PP, but the present disclosure is not limited thereto. The display device 1 may include various types of sensors capable of detecting the position of the user's pupil PP.

The plurality of infrared cameras C1, C2, C3, C4, C5, C6, C7, and C8 may be disposed on the rear surface DP_RS of the display unit DP. The plurality of infrared cameras C1, C2, C3, C4, C5, C6, C7, and C8 may be disposed to overlap a plurality of transmission regions of the display unit DP to be described later, respectively.

The plurality of infrared cameras C1, C2, C3, C4, C5, C6, C7, and C8 may sense the infrared rays reflected from the user's pupil PP after being emitted from the infrared light sources. The exact position of the user's pupil PP may be calculated by ultraviolet rays sensed by the plurality of infrared cameras C1, C2, C3, C4, C5, C6, C7, and C8.

The plurality of infrared cameras C1, C2, C3, C4, C5, C6, C7, and C8 may include an image sensor capable of sensing the infrared rays. The plurality of infrared cameras C1, C2, C3, C4, C5, C6, C7, and C8 may generate image data based on the received infrared rays. Each of the plurality of infrared cameras C1, C2, C3, C4, C5, C6, C7, and C8 may capture an image in front of it, and the gaze direction of the user may be calculated from the captured image based on the position of the user's pupil PP.

The plurality of infrared cameras C1, C2, C3, C4, C5, C6, C7, and C8 may include the first infrared camera C1, the second infrared camera C2, the third infrared camera C3, the fourth infrared camera C4, the fifth infrared camera C5, the sixth infrared camera C6, the seventh infrared camera C7, and the eighth infrared camera C8.

The first infrared camera C1, the second infrared camera C2, the third infrared camera C3, the fourth infrared camera C4, the fifth infrared camera C5, the sixth infrared camera C6, the seventh infrared camera C7, and the eighth infrared camera C8 may be disposed to overlap the first sub-lens LS11, the second sub-lens L12, the third sub-lens L13, the fourth sub-lens LS14, the fifth sub-lens L21, the sixth sub-lens L22, the seventh sub-lens L23, and the eighth sub-lens L24 in the thickness directions, respectively.

The first infrared camera C1, the second infrared camera C2, the third infrared camera C3, and the fourth infrared camera C4 may be disposed adjacent to the boundary of the first multi-channel lens LS1 in a plan view.

The first infrared camera C1, the second infrared camera C2, the third infrared camera C3, and the fourth infrared camera C4 may overlap the boundary of the first multi-channel lens LS1 in the thickness direction (i.e., in a plan view).

The boundary of the first multi-channel lens LS1 may refer to an edge of the first multi-channel lens LS1 adjacent to or in close contact with the front surface DP_FS of the display unit DP and/or an outermost edge of the other side of the first multi-channel lens LS1 facing the front surface DP_FS of the display unit DP. The boundary of the first multi-channel lens LS1 may include edges of the first sub-lens LS11, the second sub-lens L12, the third sub-lens L13, and the fourth sub-lens LS14, which are adjacent to or in close contact with the front surface DP_FS of the display unit DP.

However, the present disclosure is not limited thereto, and the first infrared camera C1, the second infrared camera C2, the third infrared camera C3, and the fourth infrared camera C4 may be disposed inside with respect to the boundary of the first multi-channel lens LS1 in a plan view.

The fifth infrared camera C5, the sixth infrared camera C6, the seventh infrared camera C7, and the eighth infrared camera C8 may also be disposed in substantially the same or similar manner as the first infrared camera C1, the second infrared camera C2, and the fourth infrared camera C4, respectively, with respect to the second multi-channel lens LS2.

The infrared camera that receives the infrared ray reflected from the user's pupil PP may vary depending on the user's gaze direction and/or the position of the user's pupil PP.

For example, when the user gazes in the direction in which the first sub-lens LS11 is located, the infrared ray emitted from the first infrared light source L1 may be reflected from the user's pupil PP and received by the first infrared camera C1. As another example, when the user gazes in the direction in which the fourth sub-lens LS14 is located, the infrared ray emitted from the fourth infrared light source L4 may be reflected from the user's pupil PP and received by the fourth infrared camera C4. Likewise, although not shown, when the user gazes in the direction in which the second sub-lens L12 is located or in the direction in which the third sub-lens L13 is located, the infrared ray reflected from the user's pupil PP may be received by the second infrared camera C2 or the fourth infrared camera C4.

The display device 1 according to one embodiment may be implemented to be slim in thickness as the plurality of infrared light sources L1, L2, L3, L4, L6, L7, and L8 and the plurality of infrared cameras C1, C2, C3, C4, C5, C6, C7, and C8 are disposed on the first multi-channel lens LS1 or on the rear surface LS1 of the display unit DP, without being disposed between the first multi-channel lens LS1 and the user's eyeball.

The plurality of transmission regions may transmit most of the light incident on the front surface DP_FS of the display unit DP. The plurality of transmission regions may transmit only the light in a specific wavelength band, for example, an infrared ray, among the light incident on the front surface DP_FS of the display unit DP. The light transmitted through the plurality of transmission regions may be sent to the infrared camera disposed on the rear surface DP_RS of the display unit DP.

The display device 1 may further include the light steerer BD. The light steerer BD may move the display image to the center of the gaze vector by controlling the light output direction of the second display panel DP2. The light steerer BD may be a deflector. The angle of refraction of the deflector is equal to or larger than 5°.

Light steerers BD1 and BD2 may be interposed between the second display panel DP2 and the multi-channel lenses LS1 and LS2. The light steerers BD1 and BD2 may be interposed between the second display panel DP2 and the first display panel DP1. The light steerers BD1 and BD2 may be disposed to overlap the second display panel DP2 in the thickness direction.

The light steerers BD1 and BD2 are formed to have a circular shape to correspond to the shape of the second display panel DP2, but are not limited thereto, and may have various modifications according to the shape of the second display panel DP2.

The controller may control the light steering angle of the light steerers BD1 and BD2. The controller may perform an operation for adjusting the direction of light outputted from the second display panel DP2 based on the user's gaze vector.

The light steerers BD1 and BD2 may include the first light steerer BD1 and the second light steerer BD2. The first light steerer BD1 may be interposed between the third sub-display panel DP2-1 and the first multi-channel lens LS1. The first light steerer BD1 overlaps the third sub-display panel DP2-1. The first light steerer BD1 adjusts the direction of the light emitted from the third sub-display panel DP2-1. The first light steerer BD1 may be in contact with the third sub-display panel DP2-1, but is not limited thereto, and the first light steerer BD1 may be spaced apart from the third sub-display panel DP2-1. The first light steerer BD1 may have a circular shape to correspond to the shape of the third sub-display panel DP2-1.

The second light steerer BD2 may be interposed between the fourth sub-display panel DP2-2 and the second multi-channel lens LS2. The second light steerer BD2 overlaps the fourth sub-display panel DP2-2. The second light steerer BD2 adjusts the direction of the light emitted from the fourth sub-display panel DP2-2. The second light steerer BD2 may be in contact with the fourth sub-display panel DP2-2, but is not limited thereto, and the second light steerer BD2 may be spaced apart from the fourth sub-display panel DP2-2. The second light steerer BD2 may have a circular shape to correspond to the shape of the fourth sub-display panel DP2-2.

The display device 1 according to one embodiment may direct an image displayed by the second display panel DP2 having a high resolution to the center of the user's field of view through the eye tracking unit 160.

Figure 19:
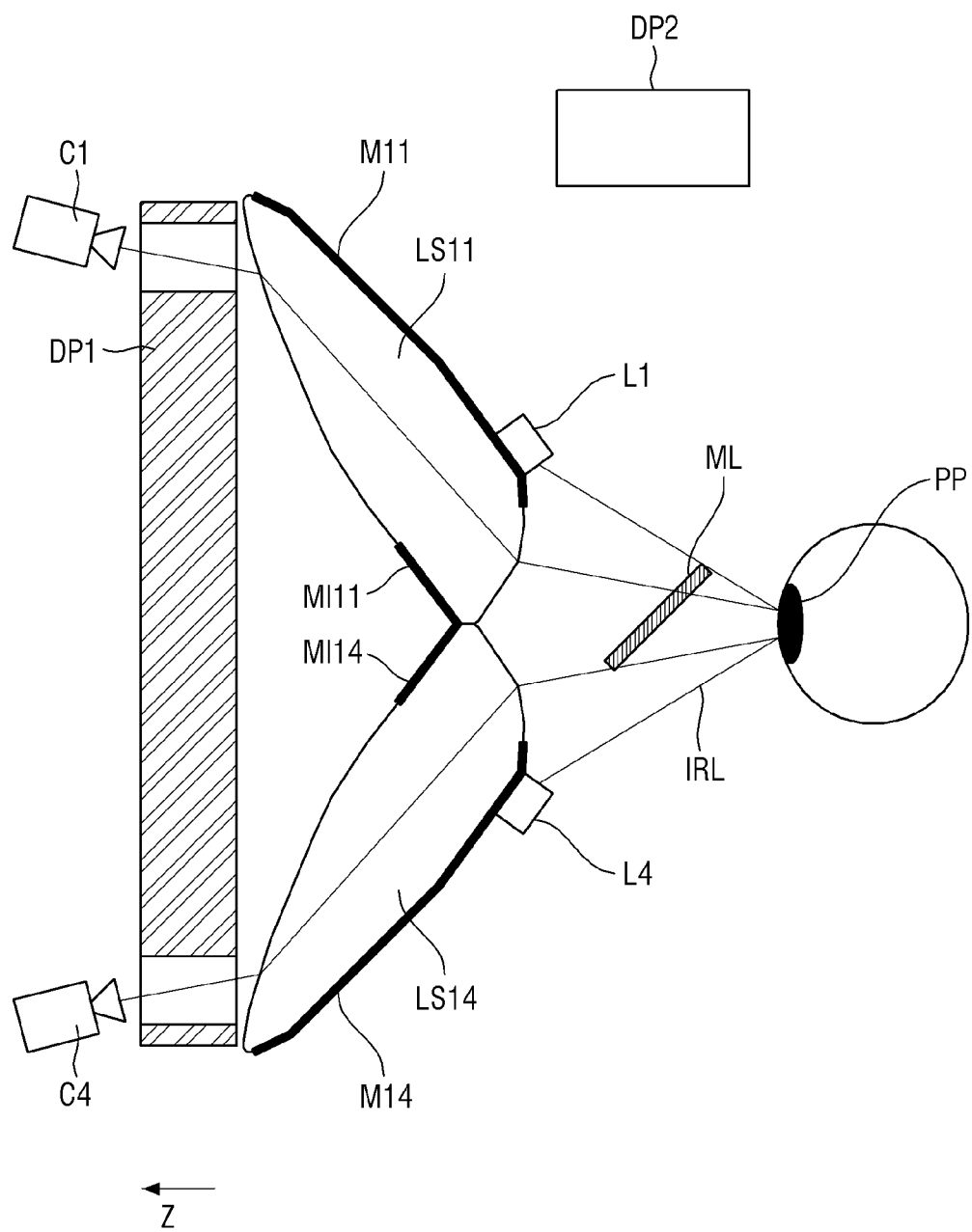
FIG. 19 is a cross-sectional view of a display unit according to another modification example.
Figure 20:
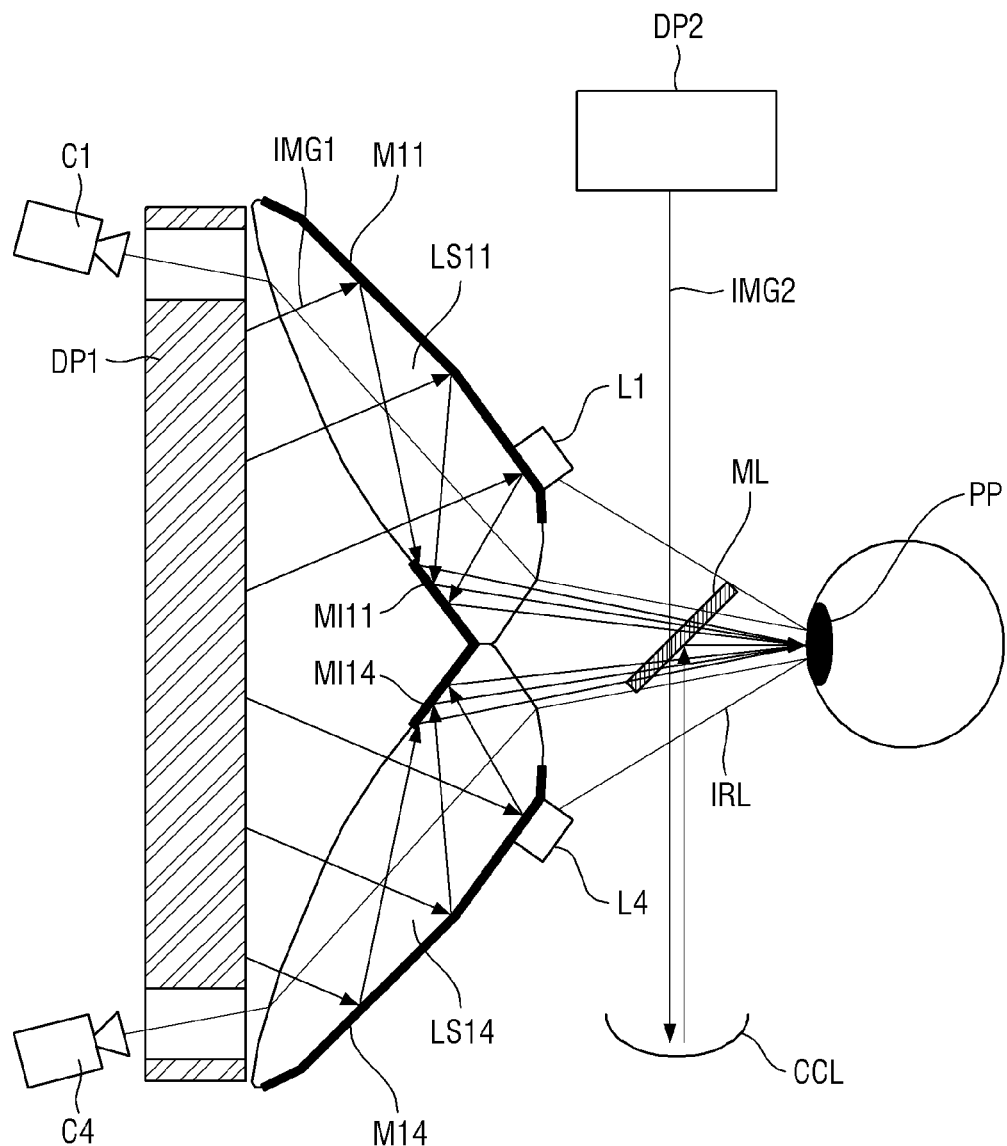
FIG. 20 is a cross-sectional view of the display unit showing light emitted from a display panel of FIG. 19.
Figure 21:
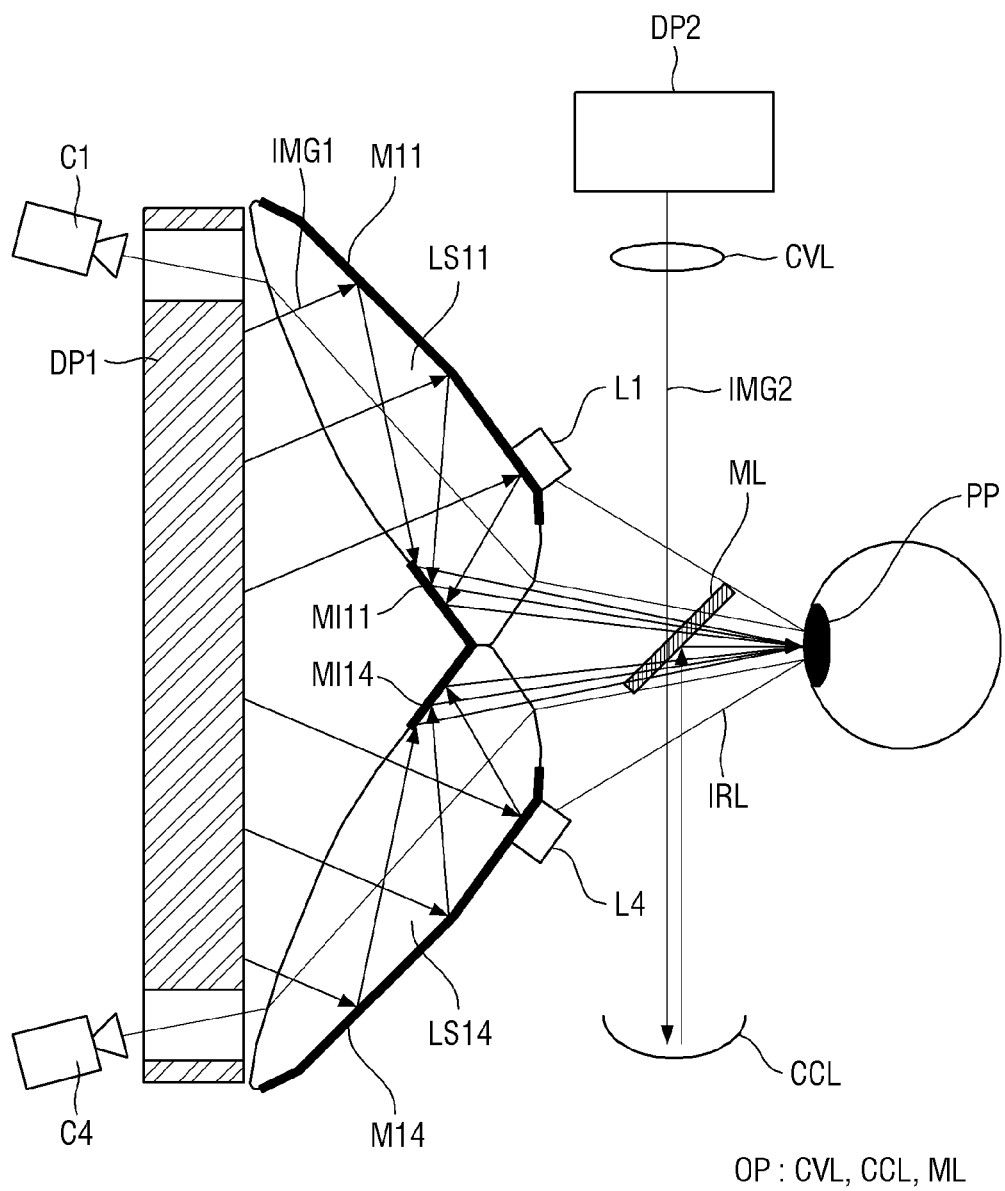
FIGS. 21 and 22 are modification examples of FIG. 19.
Figure 22:
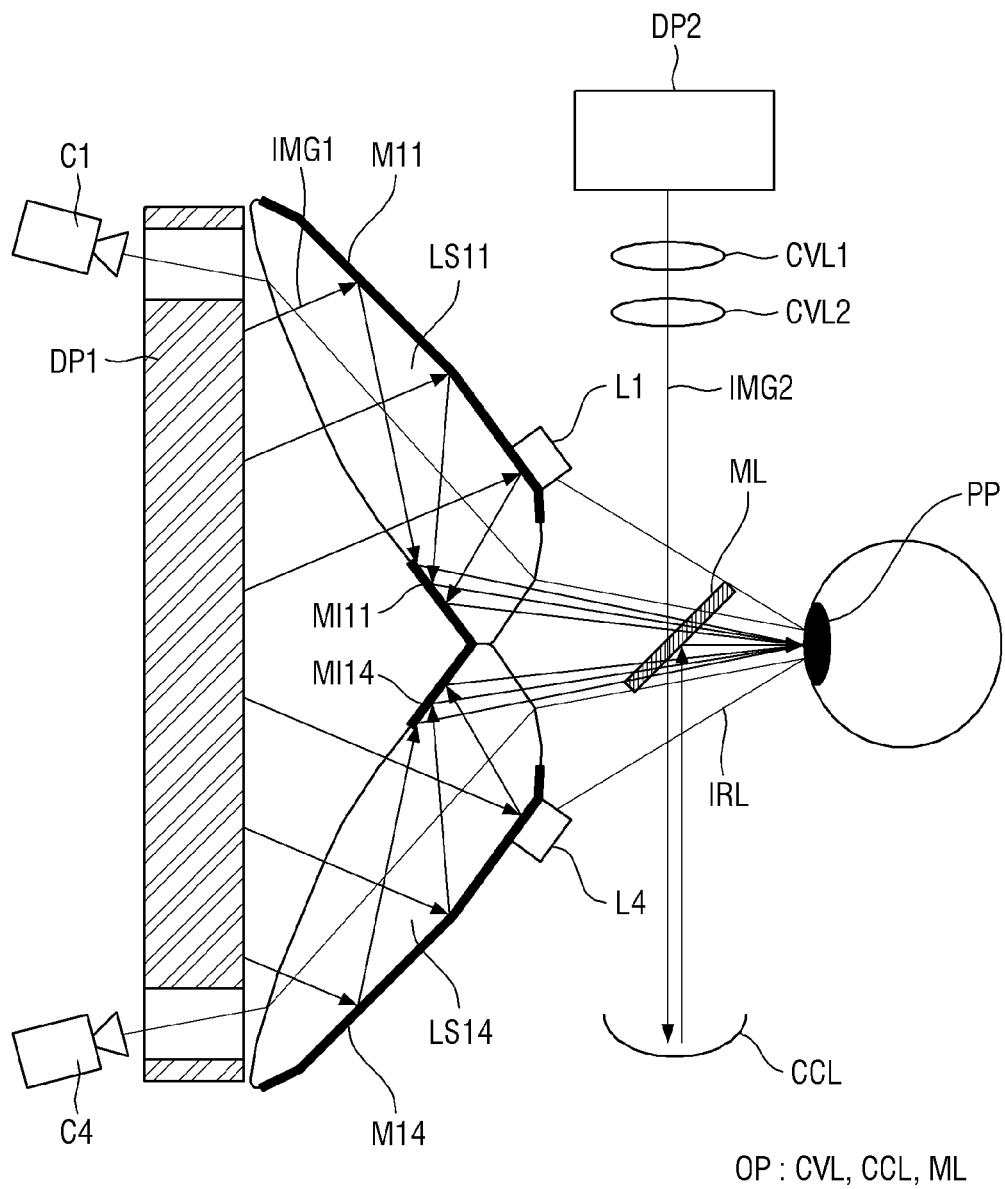

FIG. 19 is a cross-sectional view of a display unit according to another modification example, FIG. 20 is a cross-sectional view of the display unit showing light emitted from a display panel of FIG. 19, and FIGS. 21 and 22 are modification examples of FIG. 19.

In the modification examples of FIGS. 19 to 22, the first display panel DP1 and the second display panel DP2 are not disposed on the same plane. For example, the first display panel DP1 and the second display panel DP2 may be disposed perpendicular to each other. That is, the second display panel DP2 may not be overlap the first display panel DP1 in a thickness direction (i.e., Z-axis direction) of the first display panel DP1. The front surface DP1_FS of the first display panel DP1 and the front surface DP2_FS of the second display panel DP2 may be disposed perpendicular to each other.

Members for changing a path (i.e., optical path changing member OP) are disposed on an optical path of light emitted from the second display panel DP2. The members for changing the optical path may include one lens, or may include a plurality of lenses. For example, the member for changing the optical path may include a convex lens, a concave lens and/or a convex lens having one flat side.

Referring to FIGS. 19 and 20, a half mirror ML and a concave mirror CCL are positioned on the optical path emitted from the second display panel DP2.

The second display panel DP2, the half mirror ML, and the concave mirror CCL are sequentially disposed. That is, the half mirror ML is disposed between the second display panel DP2 and the concave mirror CCL. The half mirror ML refers to a lens (or mirror) having one surface that transmits incident light and the other surface, opposite to the one surface, that reflects light. Light of the first display panel DP1 and the second display panel DP2 is incident on the one surface of the half mirror ML that transmits the light. The concave mirror CCL is disposed on the optical path of the second display panel facing the other surface of the half mirror ML. Accordingly, the light of the second display panel incident on and reflected by the concave mirror CCL is incident on the other surface of the half mirror ML and reflected.

The half mirror ML transmits the light emitted from the second display panel DP2, and reflects the light reflected from the concave mirror CCL in the direction of the eyeball.

In one embodiment, the second display panel DP2 may be turned on/off at 120 Hz, and the half mirror ML may be turned on/off at 240 Hz, but the present disclosure is not limited thereto.

The concave mirror CCL may be subjected to aspherical treatment to prevent distortion due to spherical aberration.

The half mirror ML may be disposed between the multi-channel lens LS1 and the eyeball. The half mirror ML transmits the light emitted from the first display panel DP1.

The half mirror ML may combine the lights outputted from the second display panel DP2 and the first display panel DP1, and transmit the combined light to the user's eyes. Accordingly, the user may recognize one complete and high-resolution image.

In another modification example, one or more light magnification members may be disposed between the second display panel DP2 and the half mirror ML, as illustrated in FIG. 21 and FIG. 22.

The second display panel DP2 does not overlap the first display panel in the thickness direction. Accordingly, the sense of distance may be different between the second display image of the second display panel DP2 and the first display image of the first display panel DP1. In order to adjust this, one or more light magnification members may be disposed in the light traveling direction of the second display panel DP2.

The light magnification member may be one or more of a convex lens CVL and a concave lens (not shown).

In one embodiment, the convex lens CVL may be further positioned between the second display panel DP2 and the half mirror ML. The convex lens CVL may perform a function of enlarging the light emitted from the second display panel DP2 at a predetermined magnification. Accordingly, the convex lens CVL adjusts the depth of the image of the second display panel DP2. A difference in the sense of depth between the first display panel DP1 and the second display panel DP2 may be adjusted. The convex lens CVL may perform a function of enlarging the light emitted from the second display panel DP2 at a predetermined magnification.

Figure 23:
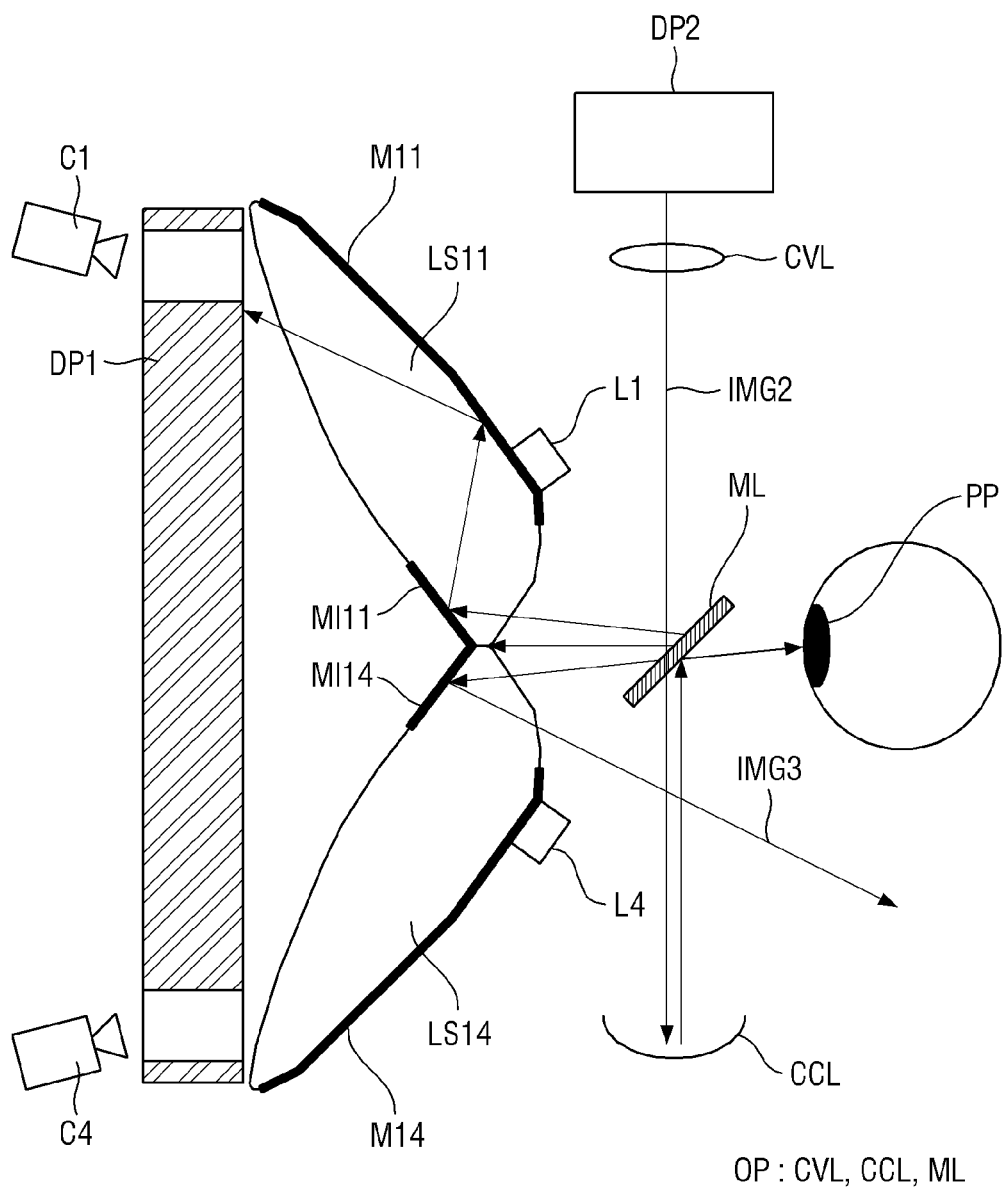
FIG. 23 is a cross-sectional view for describing a ghost image display path of a display device and a cause thereof.

FIG. 23 is a cross-sectional view for describing a ghost image display path of a display device and a cause thereof.

Referring to FIGS. 22 and 23, the light emitted from the second display panel DP2 and incident on the half mirror ML is desirably transmitted to the concave mirror CCL. Further, the light emitted from the first display panel DP1 and incident on the half mirror ML is desirably transmitted to proceed in the direction of the eyeball. However, some of the light supposed to be transmitted through the half mirror ML in this way is reflected and incident on the multi-channel lens LS1. Referring to FIGS. 11 and 22, when the light incident to the first multi-channel lens LS1 is reflected from the first to fourth mirror coating regions M11, M12, M13, and M14, unplanned light paths are formed and a ghost image is displayed.

As shown in FIGS. 19 to 13, even when the first display panel DP1 and the second display panel DP2 are not disposed on the same plane, the position of the pupil may be tracked by the eye tracking unit 160. Since the eye tracking unit 160 is substantially the same as or similar to the eye tracking unit 160 described with reference to FIGS. 16 to 18, redundant description thereof will be omitted.

The processor adjusts the angle of the half mirror ML based on the position of the pupil detected by the eye tracking unit 160 so that the second display image of the second display panel DP2 corresponds to the foveal vision.

In one embodiment, the angle of the half mirror ML may be changed by an electromagnetic force, a piezoelectric force, or the like.

Figure 24:
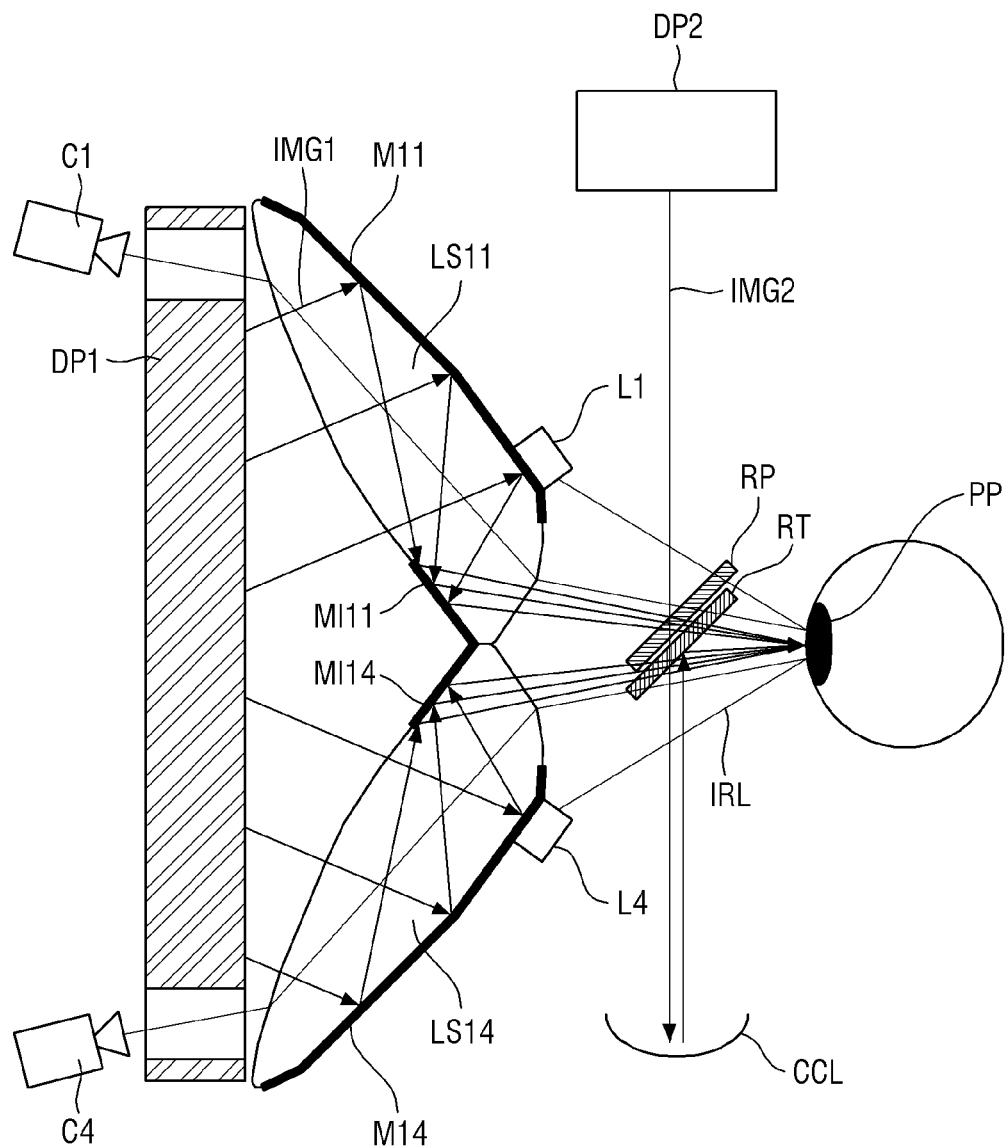
FIG. 24 is a cross-sectional view of a display unit according to an embodiment for preventing ghost light.
Figure 25:
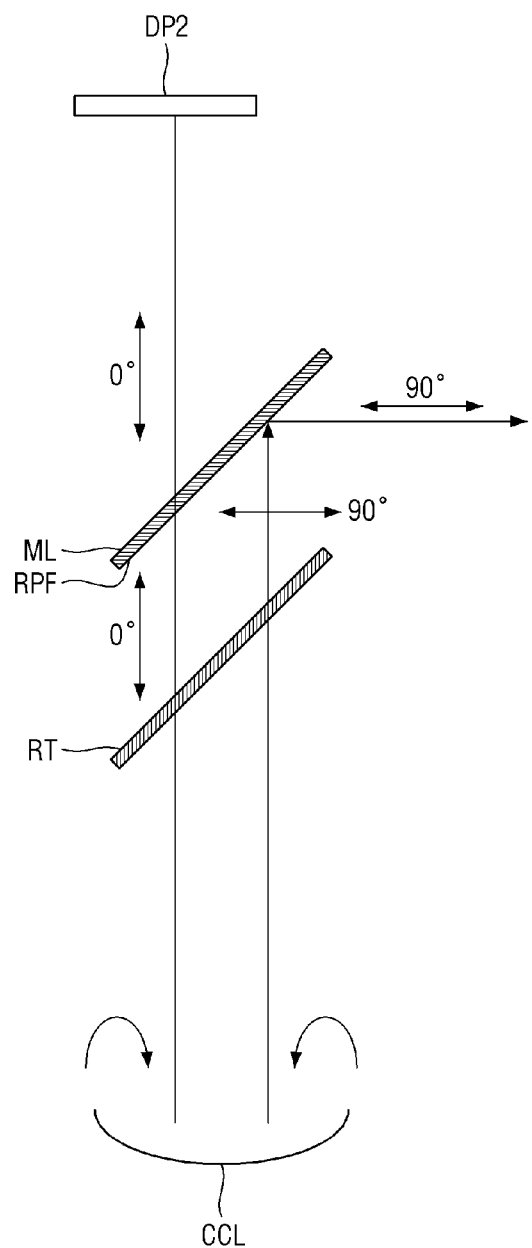
FIG. 25 is a detailed explanatory view.

Hereinafter, referring to FIGS. 24 and 25, a polarization control member may be further used to prevent an unplanned ghost image emitted from at least one of the first display panel DP1 or the second display panel DP2 and reflected from the half mirror ML.

A reflective polarization film RPF may be attached to the reflective surface of the half mirror ML. In another modification example, a reflective polarizer RP may be disposed instead of the half mirror ML.

In addition, a phase delay element RT may be disposed in parallel with the half mirror ML. The phase delay element RT is disposed between the half mirror ML and the concave mirror CCL on the optical path of the second display panel DP2. The phase delay element RT may be a retarder.

Accordingly, the ghost image may not be recognized by the user.

Figure 26:
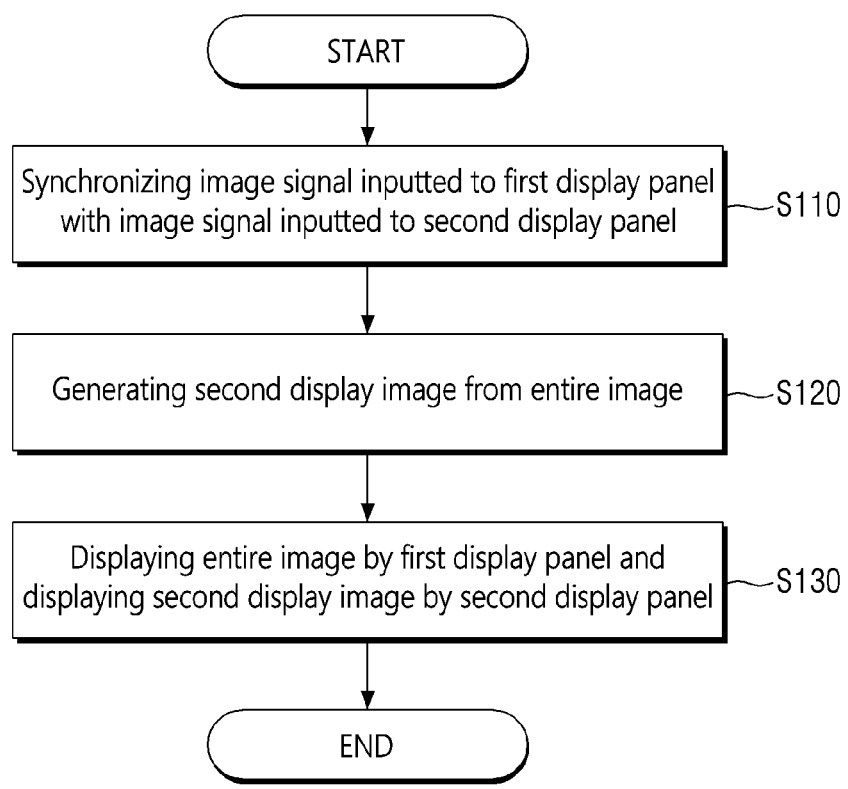
FIG. 26 is a flowchart illustrating a display device control method according to one embodiment.

FIG. 26 is a flowchart illustrating a display device control method according to one embodiment.

A method of controlling the display device 1 may include a head mounted display control method. The method of controlling the display device 1 may be performed by the above-described controller.

The method of controlling the display device 1 may include a head mounted display control method. The method of controlling the display device 1 may be performed by the above-described controller.

In step S110, the processor synchronizes an image signal inputted to the first display panel DP1 with an image signal inputted to the second display panel DP2. For this synchronization, a reference image is first determined. In one embodiment, the reference image is set to be an image inputted to the second display panel DP2, but is not limited thereto. For each frame, an image inputted to the second display panel DP2, which is the reference image, and an image inputted to the first display panel DP1 may be synchronized.

In step S120, the processor generates a second display image of the second display panel DP2. The display image is an image displayed by the second display panel DP2, and may imply an image and/or a video recognized by the user. The processor separates an image corresponding to the foveal vision region from the entire image. The separated image corresponding to the foveal vision region becomes the second display image of the second display panel DP2.

In step S130, the second display panel DP2 displays the second display image, and the first display panel DP1 displays the entire image.

In the embodiment in which the second display panel DP2 is embedded in the central region of the first display panel DP1, it is not necessary to cut out an area corresponding to the second display image from the entire image of the first display panel DP1.

Figure 27:
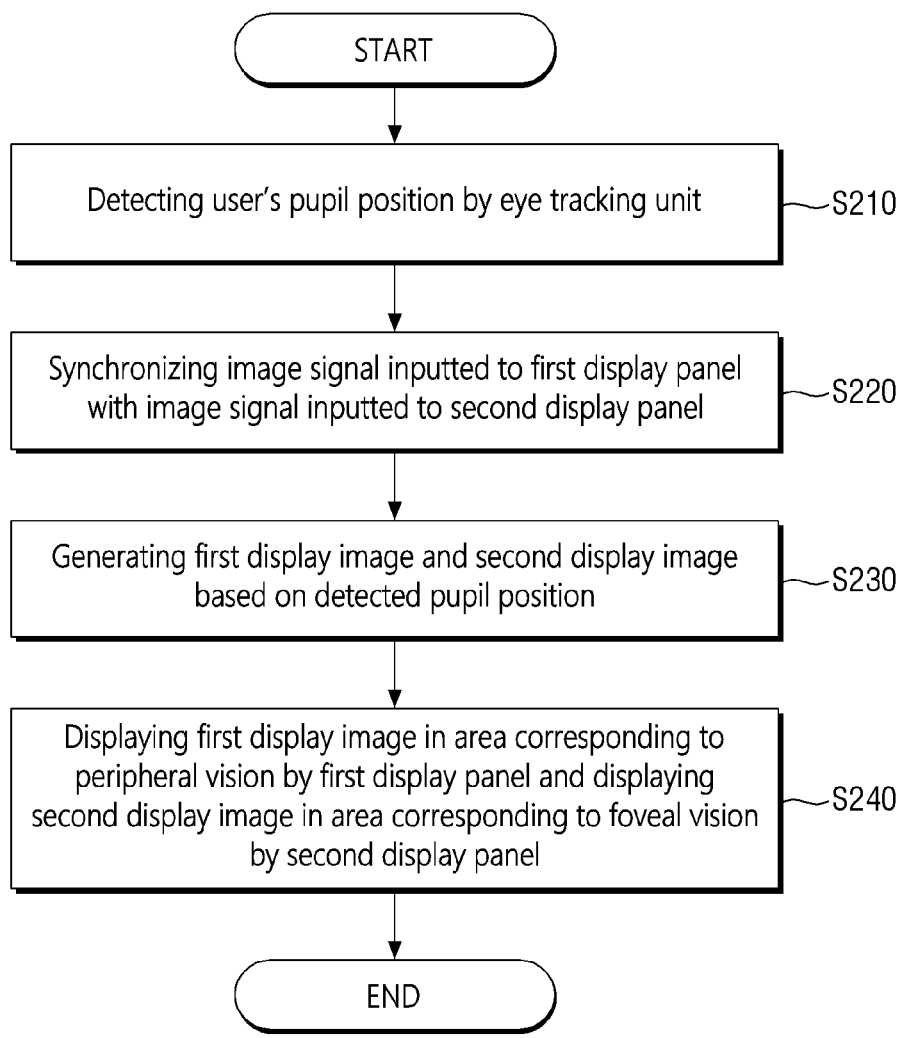
FIG. 27 is a flowchart of a display device control method according to another embodiment.

FIG. 27 is a flowchart of a display device control method according to another embodiment.

FIG. 27 illustrates a method of controlling a display device including an eye tracking unit.

The display device control method may include a head mounted display control method. The display device control method may be performed by the above-described controller.

In step S210, the eye tracking unit 160 detects the position of the user's pupil.

In one embodiment, the infrared ray reflected from the user's pupil PP may be received through the camera provided at the first display panel DP1, and the position of the user's pupil PP may be detected based on the received infrared ray.

Referring further to FIGS. 15 and 17, the position of the user's pupil PP may be detected by the plurality of infrared cameras C1, C2, C3, C4, C5, C6, C7, and C8 respectively disposed to overlap the transmission regions TR on the rear surface DP_RS of the first display panel DP1 to determine the gaze direction of the user.

Meanwhile, when the user gazes at the center of the first multi-channel lens LS1, the infrared ray reflected from the user's pupil PP is not received by the first to fourth infrared cameras C1 to C4. As a result, the user's pupil PP may not be detected. In this case, the coordinates of the pupil PP of the user may be determined to be (0,0).

On the other hand, when the user gazes at an area other than the center area of the first multi-channel lens LS1, the pupil PP of the user may be detected by at least one of the first to fourth infrared cameras C1 to C4.

For example, when the user gazes in the direction in which the first multi-channel lens LS1 is located, the user's pupil PP may be detected by the first infrared camera C1. In this case, the coordinates of the user's pupil PP may be determined to be located in a first quadrant P1_1 (e.g., (3, 1)).

In step S220, the processor synchronizes an image signal inputted to the first display panel DP1 with an image signal inputted to the second display panel DP2. For the synchronization, a reference image is first determined. In one embodiment, the reference image is set to be an image inputted to the second display panel DP2, but is not limited thereto. For each frame, an image inputted to the second display panel DP2, which is the reference image, and an image inputted to the first display panel DP1 may be synchronized.

In step S230, the processor generates a second display image of the second display panel DP2 and a first display image of the first display panel DP1. The processor separates, from the entire image, an image corresponding to the foveal vision region based on the pupil position detected in step S210. The separated image corresponding to the foveal vision region becomes the second display image of the second display panel DP2, and the remaining image corresponding to the area other than the separated foveal vision region becomes the first display image of the first display panel DP1. In another modification example, blur processing may be performed on an edge generated by the separation of the foveal vision region in the first display image of the first display panel DP1.

In step S240, the second display panel DP2 displays the second display image in an area corresponding to the foveal vision, and the first display panel DP1 displays the first display image in an area corresponding to the peripheral vision.

However, the method of controlling the display device 1 is not limited to the above-described example, and at least a part of the steps may be omitted, or at least one other step may be further included with reference to the other description of the present specification.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:
   a first display panel having a first resolution;
   a second display panel having a second resolution; and
   a first multi-channel lens and a second multi-channel lens disposed on one surface of the first display panel and one surface of the second display panel and comprising a plurality of channels through which light emitted from the one surface of the first display panel and the one surface of the second display panel passes,
   wherein the second resolution is higher than the first resolution, and
   the first display panel surrounds the second display panel in a plan view,
   wherein the first display panel defines a through-hole penetrating the first display panel in a region overlapping the second display panel in the plan view,
   wherein the second display panel is embedded in the through-hole.

2. The display device of claim 1, wherein the second display panel has about twice as many pixels per inch (PPI) as the first display panel.

3. The display device of claim 1, wherein the first display panel comprises a first sub-display panel corresponding to a left eye and a second sub-display panel corresponding to a right eye, and the second display panel comprises a third sub-display panel corresponding to the left eye and a fourth sub-display panel corresponding to the right eye.

4. The display device of claim 3, wherein each of the first sub-display panel and the second sub-display panel has a viewing angle of about 20° to about 80°, and each of the third sub-display panel and the fourth sub-display panel has a viewing angle of about 1° to about 20°.

5. The display device of claim 3, wherein the first sub-display panel defines at its center a first through-hole in which the third sub-display panel is embedded, and the second sub-display panel defines at its center a second through-hole in which the fourth sub-display panel is embedded, the through-hole includes the first through-hole and the second through-hole.

\* \* \* \* \*